(12) United States Patent
Tanada et al.

(10) Patent No.: US 7,226,817 B2
(45) Date of Patent: Jun. 5, 2007

(54) METHOD OF MANUFACTURING

(75) Inventors: Yoshifumi Tanada, Kanagawa (JP); Atsuo Isobe, Kanagawa (JP); Hiroshi Shibata, Yamagata (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 42 days.

(21) Appl. No.: 10/330,015

(22) Filed: Dec. 27, 2002

(65) Prior Publication Data

US 2003/0181043 A1   Sep. 25, 2003

(30) Foreign Application Priority Data

Dec. 28, 2001 (JP) ............................. 2001-401226

(51) Int. Cl.
*H01L 21/00* (2006.01)

(52) U.S. Cl. ................ 438/149; 438/795; 257/E21.411

(58) Field of Classification Search ................ 438/149, 438/151, 164, 308, 364, 378, 479, 482, 486–488, 438/490, 491, 795; 257/E21.411
See application file for complete search history.

(56) References Cited

U.S. PATENT DOCUMENTS

| | | | |
|---|---|---|---|
| 4,330,363 A | | 5/1982 | Biegesen et al. |
| 4,710,604 A | | 12/1987 | Shirasu et al. |
| 5,097,297 A | | 3/1992 | Nakazawa |
| 5,145,808 A | * | 9/1992 | Sameshima et al. .......... 117/44 |
| 5,163,220 A | | 11/1992 | Zeto et al. |
| 5,578,897 A | * | 11/1996 | Nomura et al. ............. 313/310 |
| 5,589,406 A | * | 12/1996 | Kato et al. .................. 438/164 |

(Continued)

FOREIGN PATENT DOCUMENTS

EP   1 049 144 A1   11/2000

(Continued)

OTHER PUBLICATIONS

Geis et al., "Crystalline Silicon on Insulators by Graphoepitaxy," IEEE 1979, pp. 210-212.

(Continued)

*Primary Examiner*—Michael Lebentritt
*Assistant Examiner*—Stanetta Isaac
(74) *Attorney, Agent, or Firm*—Eric J. Robinson; Robinson Intellectual Property Law Office, P.C.

(57) ABSTRACT

A method of efficiently forming a circuit using a thin film transistor with a semiconductor layer in which preferable crystallinity is obtained is provided. A location on which stress concentrates according to crystallization of a semiconductor layer formed on a substrate having unevenness corresponds to the edges and their vicinities of the unevenness provided on the substrate, that is, the boundary between a concave portion and a convex portion and its vicinities. Thus, the location in which stress concentration is caused can be specified and controlled according to the shape of a slit-shaped base layer. In addition, an island-like semiconductor layer (1305) which becomes the active layer of a TFT is formed on the concave portion or the convex portion of the substrate having the unevenness. At this time, at least a portion which becomes the channel formation region of the TFT is formed without crossing the boundary between the concave portion and the convex portion. Such TFTs are used in parallel to construct a TFT having a large channel width so that fluctuation in electrical characteristics is averaged.

28 Claims, 20 Drawing Sheets

U.S. PATENT DOCUMENTS

| | | | |
|---|---|---|---|
| 5,594,296 A * | 1/1997 | Mitsutake et al. | 313/309 |
| 5,636,042 A | 6/1997 | Nakamura et al. | |
| 5,643,826 A | 7/1997 | Ohtani et al. | |
| 5,659,329 A * | 8/1997 | Yamanobe et al. | 345/74.1 |
| 5,731,613 A * | 3/1998 | Yamazaki et al. | 257/350 |
| 5,759,879 A | 6/1998 | Iwasaki | |
| 5,776,803 A * | 7/1998 | Young | 438/149 |
| 5,841,097 A | 11/1998 | Esaka et al. | |
| 5,847,780 A | 12/1998 | Kim et al. | |
| 5,851,862 A | 12/1998 | Ohtani et al. | |
| 5,854,803 A | 12/1998 | Yamazaki et al. | |
| 5,858,823 A | 1/1999 | Yamazaki et al. | |
| 5,932,893 A | 8/1999 | Miyanaga et al. | |
| 5,953,597 A | 9/1999 | Kusumoto et al. | |
| 5,959,313 A * | 9/1999 | Yamazaki et al. | 257/59 |
| 5,965,915 A | 10/1999 | Yamazaki et al. | |
| 5,970,368 A * | 10/1999 | Sasaki et al. | 438/487 |
| 5,981,974 A | 11/1999 | Makita | |
| 5,986,306 A * | 11/1999 | Nakajima et al. | 257/353 |
| 5,994,174 A * | 11/1999 | Carey et al. | 438/166 |
| 6,133,583 A | 10/2000 | Ohtani et al. | |
| 6,162,667 A * | 12/2000 | Funai et al. | 438/166 |
| 6,184,559 B1 | 2/2001 | Hayakawa et al. | |
| 6,210,996 B1 | 4/2001 | Yamazaki et al. | |
| 6,283,813 B1 * | 9/2001 | Kaneko et al. | 445/24 |
| 6,288,414 B1 | 9/2001 | Ahn | |
| 6,291,320 B1 | 9/2001 | Yamazaki et al. | |
| 6,307,214 B1 | 10/2001 | Ohtani et al. | |
| 6,337,259 B1 * | 1/2002 | Ueda et al. | 438/471 |
| 6,355,940 B1 | 3/2002 | Koga et al. | |
| 6,365,933 B1 | 4/2002 | Yamazaki et al. | |
| 6,372,562 B1 * | 4/2002 | Matsumoto | 438/164 |
| 6,387,779 B1 * | 5/2002 | Yi et al. | 438/486 |
| 6,388,386 B1 | 5/2002 | Kunii et al. | |
| 6,410,368 B1 | 6/2002 | Kawasaki et al. | |
| 6,424,331 B1 | 7/2002 | Ozawa | |
| 6,429,100 B2 | 8/2002 | Yoneda | |
| 6,455,360 B1 * | 9/2002 | Miyasaka | 438/166 |
| 6,475,840 B1 | 11/2002 | Miyanaga et al. | |
| 6,482,721 B1 * | 11/2002 | Lee | 438/486 |
| 6,492,659 B1 * | 12/2002 | Yamazaki et al. | 257/59 |
| 6,555,875 B2 | 4/2003 | Kawasaki et al. | |
| 6,566,179 B2 * | 5/2003 | Murley et al. | 438/166 |
| 6,583,440 B2 | 6/2003 | Yasukawa | |
| 6,602,744 B1 | 8/2003 | Ino et al. | |
| 6,602,758 B2 * | 8/2003 | Kizilyalli et al. | 438/424 |
| 6,632,696 B2 | 10/2003 | Kimura et al. | |
| 6,642,569 B2 * | 11/2003 | Mori et al. | 257/314 |
| 6,653,212 B1 | 11/2003 | Yamanaka et al. | |
| 6,700,133 B1 | 3/2004 | Ohtani et al. | |
| 6,727,122 B2 * | 4/2004 | Seo et al. | 438/149 |
| 6,759,628 B1 | 7/2004 | Ino et al. | |
| 6,812,491 B2 | 11/2004 | Kato et al. | |
| 6,841,434 B2 | 1/2005 | Miyairi et al. | |
| 6,841,797 B2 | 1/2005 | Isobe et al. | |
| 6,847,050 B2 | 1/2005 | Yamazaki et al. | |
| 6,861,614 B1 | 3/2005 | Tanabe et al. | |
| 6,862,008 B2 | 3/2005 | Yamazaki et al. | |
| 6,875,998 B2 | 4/2005 | Kato et al. | |
| 6,884,668 B2 | 4/2005 | Yamazaki et al. | |
| 6,888,182 B2 * | 5/2005 | Mitani et al. | 257/241 |
| 6,906,343 B2 | 6/2005 | Yamazaki | |
| 6,933,527 B2 * | 8/2005 | Isobe et al. | 257/59 |
| 2001/0000243 A1 | 4/2001 | Sugano et al. | |
| 2001/0000627 A1 | 5/2001 | Hayakawa et al. | |
| 2001/0035526 A1 | 11/2001 | Yamazaki et al. | |
| 2002/0004292 A1 | 1/2002 | Yamazaki et al. | |
| 2002/0036927 A1 * | 3/2002 | Mori et al. | 365/185.33 |
| 2002/0048864 A1 | 4/2002 | Yamazaki et al. | |
| 2002/0075208 A1 | 6/2002 | Bae et al. | |
| 2002/0096680 A1 | 7/2002 | Sugano et al. | |
| 2002/0098628 A1 | 7/2002 | Hamada et al. | |
| 2002/0119609 A1 * | 8/2002 | Hatano et al. | 438/164 |
| 2002/0121665 A1 | 9/2002 | Kawasaki et al. | |
| 2002/0134981 A1 | 9/2002 | Nakamura et al. | |
| 2003/0001800 A1 | 1/2003 | Nakajima et al. | |
| 2003/0128200 A1 | 7/2003 | Yumoto | |
| 2003/0141505 A1 | 7/2003 | Isobe et al. | |
| 2003/0141521 A1 | 7/2003 | Isobe et al. | |
| 2003/0183854 A1 | 10/2003 | Kato et al. | |
| 2003/0183875 A1 | 10/2003 | Isobe et al. | |
| 2003/0186490 A1 | 10/2003 | Kato et al. | |
| 2003/0209710 A1 | 11/2003 | Yamazaki et al. | |
| 2003/0209737 A1 * | 11/2003 | Mitani et al. | 257/241 |
| 2003/0218169 A1 | 11/2003 | Isobe et al. | |
| 2003/0218170 A1 | 11/2003 | Yamazaki et al. | |
| 2003/0218171 A1 | 11/2003 | Isobe et al. | |
| 2003/0218177 A1 | 11/2003 | Yamazaki | |
| 2003/0219935 A1 | 11/2003 | Miyairi et al. | |
| 2003/0230749 A1 | 12/2003 | Isobe et al. | |
| 2003/0230750 A1 | 12/2003 | Koyama et al. | |
| 2004/0016958 A1 | 1/2004 | Kato et al. | |
| 2004/0016967 A1 | 1/2004 | Yamazaki et al. | |
| 2004/0026696 A1 | 2/2004 | Yamazaki et al. | |
| 2005/0020096 A1 | 1/2005 | Miyairi et al. | |
| 2005/0029518 A1 | 2/2005 | Kato et al. | |
| 2005/0029519 A1 | 2/2005 | Yamazaki et al. | |
| 2005/0041005 A1 * | 2/2005 | Yamazaki et al. | 345/92 |
| 2005/0098784 A1 | 5/2005 | Isobe et al. | |

FOREIGN PATENT DOCUMENTS

| | | |
|---|---|---|
| EP | 1 067 593 | 1/2001 |
| JP | 57-157519 | 9/1982 |
| JP | 58-151042 | 9/1983 |
| JP | 59-099713 | 6/1984 |
| JP | 59-125663 | 7/1984 |
| JP | 62-104117 | 5/1987 |
| JP | 63-031108 | 2/1988 |
| JP | 06-349735 | 12/1994 |
| JP | 07-130652 | 5/1995 |
| JP | 08-070129 | 3/1996 |
| JP | 08-078329 | 3/1996 |
| JP | 08-195357 | 7/1996 |
| JP | 08-288515 | 11/1996 |
| JP | 10-012891 | 1/1998 |
| JP | 10-135468 | 5/1998 |
| JP | 10-135469 | 5/1998 |
| JP | 11-084418 | 3/1999 |
| JP | 11-354442 | 12/1999 |
| JP | 2000-68520 | 3/2000 |
| JP | 2000-349296 | 12/2000 |
| JP | 2001-011085 | 1/2001 |
| JP | 2001-144027 | 5/2001 |
| JP | 2001-196599 | 7/2001 |
| JP | 2001-319877 | 11/2001 |
| JP | 2002-014337 | 1/2002 |
| JP | 2002-313811 | 10/2002 |
| JP | 2002-324808 | 11/2002 |
| WO | WO 00/63956 | 10/2000 |

OTHER PUBLICATIONS

Geis et al., "Grapho-epitaxy of Silicon on Fused Silica Using Surface Micropatterns and Laser Crystallization," J. Vac. Sci. Tech., 16(6), Nov./Dec. 1979, pp. 1640-1643.

Specification, claims, abstract and drawings of U.S. Appl. No. 09/344,646 filed Jun. 17, 1999 entitled *Semicondctor Device and Fabrication Method Thereof*.

H.W. Lam et al., *Characteristics of MOSFETS Fabricated in Laser-Recrystallized Polysilicon Islands With a Retaining Wall Structure on an Insulating Substrate*, IEEE Electron Device Letters, vol. EDL-1, No. 10, Oct. 1980, pp. 206-208.

H.I. Smith et al., *Oriented Crystal Growth on Amorphous Substrates Using Artificial Surface-Relief Gratings*, Appl. Phys. Lett., vol. 32, No. 6, Mar. 15, 1978, pp. 349-350.

D.K. Biegelsen et al., *Laser-Induced Crystallization of Silicon Islands on Amorphous Substrates: Multilayer Structures*, Appl. Phys. Lett., vol. 38, No. 3, Feb. 1, 1981, pp. 150-152.

A. Hara et al., *Ultra-High Performance Poly-Si TFTs on a Glass by a Stable Scanning CW Laser Lateral Crystallization*, AM-LCD '01 Digest of Technical Papers, Jan. 1, 2001, pp. 227-230.

M.W. Geis, *Crystallographic Orientation of Silicon on an Amorphous Substrate Using an Artificial Surface-Relief Grating and Laser Crystallization*, Applied Physics Letters, vol. 35, No. 1, Jul. 1, 1979, pp. 71-74.

M.A. Baldo et al., *Very High-Efficiency Green Organic Light-Emitting Devices Based on Electrophosphorescence*, Applied Physics Letters, vol. 75, No. 1, Jul. 5, 1999, pp. 4-6.

T. Tsutsui, et al., *High Quantum Efficiency in Organic Light-Emitting Devices with Iridium-Complex as a Triplet Emissive Center*, Japanese Journal of Applied Physics, vol. 38, Part 2, No. 12B, Dec. 15, 1999, pp. L1502-L1504.

M.A. Baldo et al., *Highly Efficient Phosphorescent Emission from Organic Electroluminescent Devices*, Nature, vol. 395, Sep. 10, 1998, pp. 151-154.

T. Tsutsui et al., *Electroluminescence in Organic Thin Films*, Photochemical Processes in Organized Molecular Systems, Sep. 22, 1990, pp. 437-450.

M. Kishino et al., *Physics of VLSI Device*, Jan. 1, 1995, pp. 144-146.

\* cited by examiner

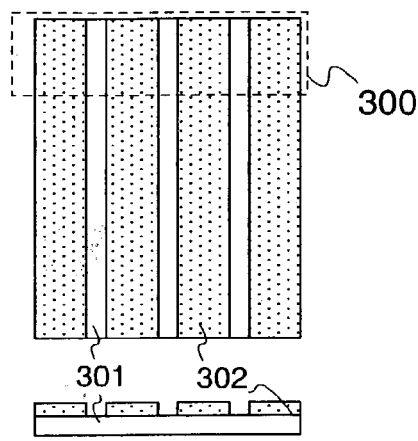
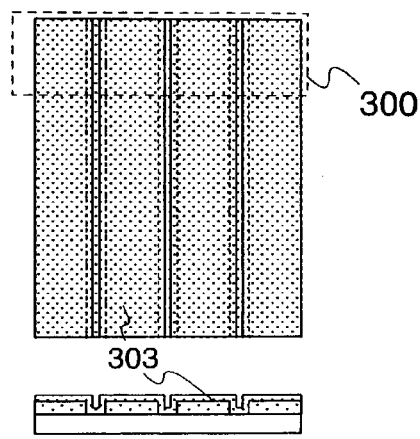
Fig. 7A                Fig. 7B
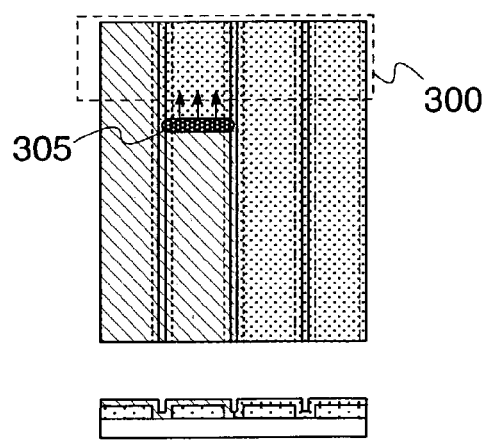
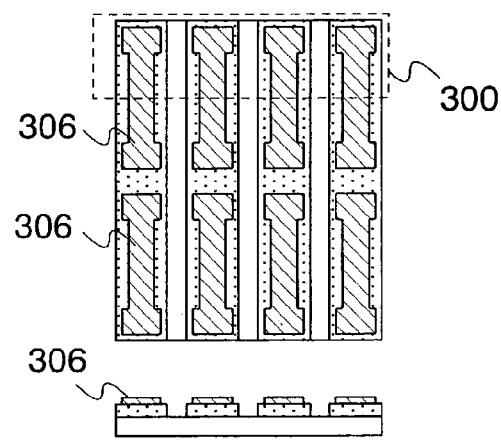
Fig. 7C                Fig. 7D
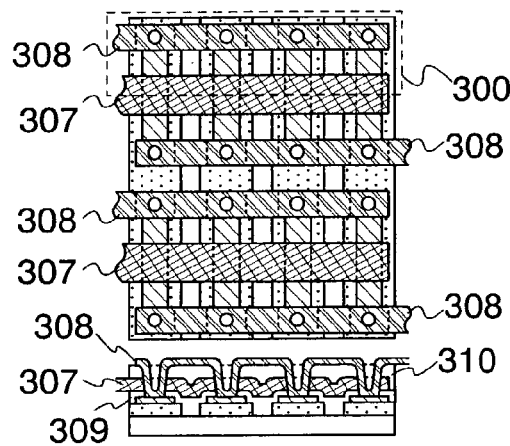
Fig. 7E

METHOD OF MANUFACTURING

BACKGROUND OF THE INVENTION

1. Field of the Invention

The present invention relates to a method of manufacturing a semiconductor device, and a semiconductor device manufactured by the manufacturing method. The semiconductor device described here includes an electro-optical device such as a liquid crystal display device and a light emitting device, and an electronic device using the device as a display portion.

2. Description of the Related Art

In recent years, there has been widely used a technique of crystallizing an amorphous semiconductor layer formed on an insulator, more specifically, a glass substrate to obtain a crystalline semiconductor layer and producing thin film transistors (hereinafter referred to as TFTs) using the crystalline semiconductor layer as an active layer, and an electrical characteristic of the TFT has been markedly improved.

Therefore, various signal processing circuits conventionally externally mounted using an IC and the like can be produced using the TFTs so that a display device in which a pixel portion and driver circuits are integrally formed on a substrate is realized. By a reduction in the number of parts, display devices are compact and lightweight, and further a manufacturing cost can be greatly reduced. Recently, research and development have been widely advanced.

As one of methods of preferably crystallizing an amorphous semiconductor layer, there is a technique of irradiating CW (continuous wave: continuous oscillation) laser light to the semiconductor layer while being scanned in a single direction so that crystals are grown in a scanning direction to form single crystals lengthened in that direction. When this method is employed, it is considered that a layer is obtained which includes few grain boundaries at least in a channel direction of the TFT. Further, the respective grain boundaries have a composition close to single crystal so that an electrical characteristic and uniformity thereof are superior.

According to this method, in order to irradiate laser light to the semiconductor layer while its energy density is continuously kept to a sufficient magnitude, laser light is linearly condensed and irradiated. Therefore, when the entire semiconductor layer on the substrate is crystallized, a laser light spot is shifted relative to the substrate to scan it on the substrate, thereby conducting laser irradiation. Thus, a point in which it takes a long time for processing becomes a problem. Note that a spot of laser light is accurately made to an elliptical shape or a rectangular shape. However, its aspect ratio is large. Thus, it is defined to be a line shape.

Also, as means for improving the crystallinity of the semiconductor layer, there is means to which the fundamental principle of graphoepitaxy is applied. This is to utilize the anisotropy of surface energy which growing crystal has, that is, a property in which all orientation surfaces are not randomly produced in crystal growth but bias in orientation is caused in a specific condition.

As shown in FIG. 1A, when Si is grown on a smooth amorphous quartz substrate or an $SiO_2$ film 201, a (100) orientation surface is easy to produce on a surface which is in contact with the substrate. However, there is no regulating element with respect to an in-plane orientation so that the orientation becomes arbitrary. Therefore, as shown in FIG. 1B, a slit-shaped unevenness portion made from a base insulating film 202 is provided on a smooth surface and crystal growth is made thereon. At this time, because Si is in contact with the bottom surface, the top surface, and the side surface of the slit, it is grown such that a (100) orientation surface and a (010) orientation surface and a (001) orientation surface which are equivalent thereto are in contact with the respective surfaces thereof. Accordingly, single crystals in which in-plane orientations vertical to and parallel to the substrate are aligned are grown. Similarly, as shown in FIG. 1C, when a slant slit-shaped unevenness portion is formed and crystal growth is made thereon, single crystals having a (110) orientation surface can be also obtained. Details on crystal growth based on this principle are described in, for example, "Crystalline Silicon on Insulators by Graphoepitaxy (1979, IEEE page 210–213)".

In FIG. 2A, a process of forming a base layer 1102 on a substrate 1101, subsequently forming a semiconductor layer 1103 thereon, and crystallizing it to obtain a crystalline semiconductor layer is considered. When the semiconductor layer formed over the substrate is crystallized, stress resulting from crystallization is produced within the layer. There is a time difference in in-plane crystallization. Thus, a stress distribution does not become uniform so that a point on which the stress concentrates appears. For example, a stress distribution as shown in FIG. 2A is caused in a grain boundary between crystal grains 1105 and in the vicinity thereof so that a surface which would originally become a smooth surface indicated by reference numeral 1104 has a shape in which the center and its vicinities of crystal grain rises. In addition, there is the case where cracks are caused as indicated by reference numeral 1106.

By the way, a driver circuit of a display device will be described as an example of a semiconductor device. FIG. 3A shows an example of a general display device. It has a pixel portion 503, a source signal line driver circuit 504, a gate signal line driver circuit 505, and the like on a substrate 501, and the resultant substrate 501 is bonded to a counter substrate 502. A signal from the outside is inputted through a flexible print circuit (FPC) 506.

FIG. 3B simply shows a configuration of the source signal line driver circuit of the display device. It has a shift register 511 composed of a plural stages of D-flip-flops 512, NANDs 513, buffers 514, sampling switches (analog switches) 515, and the like.

In accordance with clock signals (CLK and CLKb) and a start pulse (SP), sampling pulses are outputted from the shift register 511 in succession. Subsequently, they are shaped to pulses which are not duplicated between adjacent lines by the NANDs 513, passed through the buffers 514, and then inputted to the sampling switches (analog switches) 515. The sampling switches (analog switches) 515 are turned ON at timings when the sampling pulses are inputted thereto and video signals at respective times are captured to the source signal lines (S1, S2, . . . , Sn).

Here, the sampling switches (analog switches) 515 each have a large load (here, a wiring resistor, a capacitor, or the like of the source signal line). Thus, in order to provide sufficient drive capacity, a channel width (W) is increased. Further, even in the buffers 514, in order to drive the sampling switch having a large W, W in a post-stage is increased. Its size is changed according to the amount of load but is usually several hundreds of μm.

With respect to a TFT using a semiconductor layer formed on an insulating substrate as an active layer, variations in electrical characteristics resulting from in-plane nonuniformity of semiconductor crystals becomes a problem. In particular, in the case of a TFT having a large size, a degree of variations thereof cannot be neglected. Further, when the characteristics of the sampling switches and the like are varied, video signal capture operation is influenced thereby. Thus, a display quality is reduced so that it becomes serious.

SUMMARY OF THE INVENTION

The present invention has been made in view of the above problem. An object of the present invention is therefore to provide a method of efficiently forming a circuit in which fluctuation in electrical characteristics is suppressed using a TFT produced by utilizing as an active layer a semiconductor layer preferably crystallized by CW laser irradiation.

According to the present invention, as shown in FIG. 4A, a base layer made of an insulating material 1304 is formed on a substrate and then patterned into a slit shape to form a surface having unevenness. After that, a semiconductor layer is formed and crystallized. In FIG. 4A, numeral 1302 denotes a non-crystallized semiconductor layer, and numeral 1303 denotes a crystallized semiconductor layer. Then the crystallized semiconductor layer is patterned into a predetermined shape to obtain island-like semiconductor layers. The island-like semiconductor layers serve as active layers of TFTs later.

In this case also, as in a state shown in FIG. 2A, stress is resulted from the crystallization of the semiconductor layer formed over the substrate having unevenness as shown in FIG. 2B so that a stress distribution is caused within the semiconductor layer. At this time, as shown in FIG. 2B, portions on which stress concentrates correspond to edges and their vicinities of the unevenness provided on the substrate, that is, an boundary between a concave portion and a convex portion and its vicinities. Thus, portions in which stress concentration is caused can be specified and controlled according to a shape of the slit-shaped base layer.

As shown in FIG. 4B, island-like semiconductor layers 1305 which become active layers of TFTs are formed on a concave portion or a convex portion over the substrate having unevenness. At this time, at least portions which become channel formation regions of the TFTs are formed without crossing a boundary between the concave portion and the convex portion. This is because stress concentration to the semiconductor layers is caused in the boundary between the concave portion and the convex portion so that the crystallinity is poor. Note that, when a TFT having a large W is formed by connecting TFTs using the island-like semiconductor layers 1305 in parallel, in a portion which becomes a source region or a drain region thereof, the island-like semiconductor layers may be formed in a shape such that they are connected with each other in the boundary between the concave portion and the convex portion and its vicinities over the substrate.

Further, the arrangement of the island-like semiconductor layers 1305 is determined in advance such that a moving direction of charges in the channel formation regions is aligned with a direction parallel to or substantially parallel to a scanning direction of a laser light spot irradiated onto the substrate at crystallization. Thus, a longitudinal direction of crystal grains and the moving direction of charges in the channel formation regions become parallel or substantially parallel with each other. Accordingly, preferable field effect mobility is obtained.

Further, when a plurality of TFTs which each are formed by connecting the plurality of TFTs in parallel as described above as shown in FIG. 4C, variations in characteristics between respective TFTs 1306 to 1309 are averaged. Thus, electrical characteristics of elements can be uniformed.

The structure of present invention will be described bellow.

A method of manufacturing a semiconductor device according to the present invention includes:

forming a base layer on a substrate and patterning the base layer in a slit shape to form a surface having an unevenness on the substrate;

forming a semiconductor layer on the surface having the unevenness;

irradiating linearly condensed laser light to the semiconductor layer while being scanned relative to the substrate to obtain a crystalline semiconductor layer;

patterning the crystalline semiconductor layer in a predetermined shape to form island-like semiconductor layers; and producing a transistor using the island-like semiconductor layers connecting in parallel as active layers.

A method of manufacturing a semiconductor device according to the present invention includes:

forming a base layer on a substrate and patterning the base layer in a slit shape to form a surface having an unevenness on the substrate;

forming a semiconductor layer on the surface having the unevenness;

forming a metal contained layer on the semiconductor layer and performing heat treatment to obtain a first crystalline semiconductor layer;

irradiating linearly condensed laser light to the first crystalline semiconductor layer while being scanned relative to the substrate to obtain a second crystalline semiconductor layer;

patterning the second crystalline semiconductor layer in a predetermined shape to form island-like semiconductor layers; and producing a transistor using the island-like semiconductor layers connecting in parallel as active layers.

In the method of manufacturing a semiconductor device according to the present invention, the island-like semiconductor layer is patterned into a shape such that a channel formation region of the transistor does not cross a boundary between a concave portion and a convex portion on the surface having the unevenness.

In the method of manufacturing a semiconductor device according to the present invention, the laser light is irradiated from one selected from the group consisting of a continuous oscillation solid laser, a continuous oscillation gas laser, and continuous oscillation a metal laser.

In the method of manufacturing a semiconductor device according to the present invention, the laser light is irradiated from one selected from the group consisting of a continuous oscillation YAG laser, a continuous oscillation $YVO_4$ laser, a continuous oscillation YLF laser, a continuous oscillation $YAlO_3$ laser, a continuous oscillation glass laser, a continuous oscillation ruby laser, a continuous oscillation alexandrite laser, and a continuous oscillation Ti:sapphire laser.

In the method of manufacturing a semiconductor device according to the present invention, the laser light is irradiated from one selected from the group consisting of a continuous oscillation excimer laser, a continuous oscillation Ar laser, a continuous oscillation Kr laser, and a continuous oscillation $Co_2$ laser.

In the method of manufacturing a semiconductor device according to the present invention, the laser light is irradiated from one selected from the group consisting of a continuous oscillation helium-cadmium laser, a continuous oscillation copper vapor laser, and a continuous oscillation gold vapor laser.

In the method of manufacturing a semiconductor device according to the present invention, the base layer is patterned into a slit shape such that a film thickness is 30 nm to 300 nm and a width is 1 μm to 10 μm.

In the semiconductor device in which a circuit is composed of transistors according to the present invention, wherein island-like semiconductor layers are used as active layers of the transistors;

wherein the transistors are formed on a surface having unevenness which is formed by patterning a base layer in a slip shape formed on the substrate, and wherein each of the transistors uses the island-like semiconductor layers connecting in parallel.

In a semiconductor device in which a circuit is composed of transistors according to the present invention, wherein island-like semiconductor layers used as active layers of the transistors are formed by forming a base layer on a substrate and patterning the base layer in a slit shape to form a surface having an unevenness on the substrate, forming a semiconductor layer on the surface having the unevenness, irradiating linearly condensed laser light to the semiconductor layer while being scanned relative to the substrate to obtain a crystalline semiconductor layer, and patterning the semiconductor layer in a predetermined shape, and wherein each of the transistors uses the island-like semiconductor layers connecting in parallel.

In a semiconductor device in which a circuit is composed of transistors according to the present invention, wherein island-like semiconductor layers used as active layers of the transistors are formed by forming a base layer on a substrate and patterning the base layer in a slit shape to form a surface having an unevenness on the substrate, forming a semiconductor layer on the surface having the unevenness, forming a metal contained layer on the semiconductor layer and performing heat treatment to obtain a first crystalline semiconductor layer, irradiating linearly condensed laser light to the first crystalline semiconductor layer while being scanned relative to the substrate to obtain a second crystalline semiconductor layer, and patterning the second crystalline semiconductor layer in a predetermined shape, and wherein each of the transistors uses the island-like semiconductor layers connecting in parallel.

In the semiconductor device according to the present invention, each of the semiconductors is a transistor composing a circuit selected from the group consisting of a buffer circuit, an amplifying circuit, and a sampling circuit.

In the semiconductor device according to the present invention, each of the semiconductors is located such that a moving direction of all charges in a channel formation region thereof is aligned with a parallel direction or a substantially parallel direction thereto.

In the semiconductor device according to the present invention, each of the semiconductors is located such that a moving direction of all charges in a channel formation region thereof is aligned with a direction parallel to or substantially parallel to an irradiation direction of the laser light.

According to the present invention, there are provided electronic devices such as a video camera, a digital camera, a goggle type display (head mounted display), a navigation system, a sound reproducing device (car audio, audio component, or the like), a laptop personal computer, a game machine, a portable information terminal (mobile computer, mobile telephone, portable game machine, electronic book, or the like), and an image reproducing device provided with a recording medium.

BRIEF DESCRIPTION OF THE DRAWINGS

In the accompanying drawings:

FIGS. 7A to 7E are explanatory views of an embodiment mode of the present invention;

DETAILED DESCRIPTION OF THE PREFERRED EMBODIMENTS

Figure 1A:
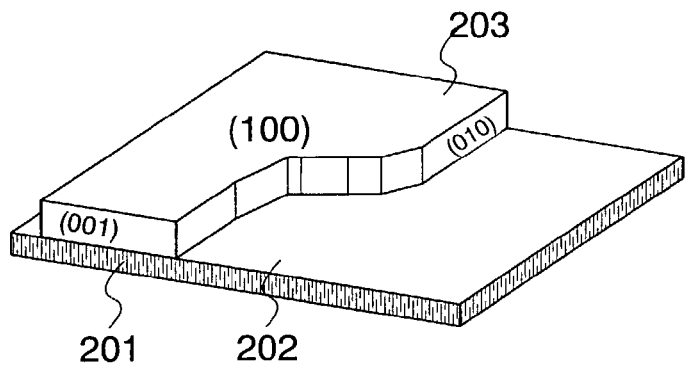
FIGS. 1A to 1C are explanatory views of a fundamental principle of graphoepitaxy.
Figure 1B:
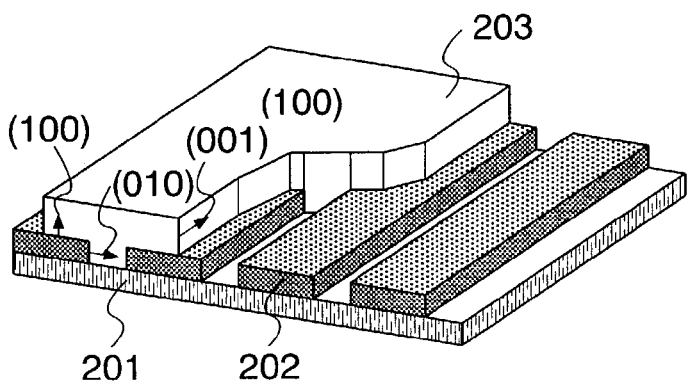
Figure 1C:
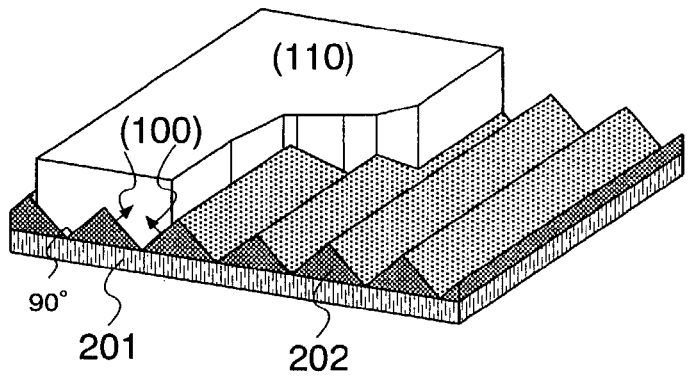
Figure 2A:
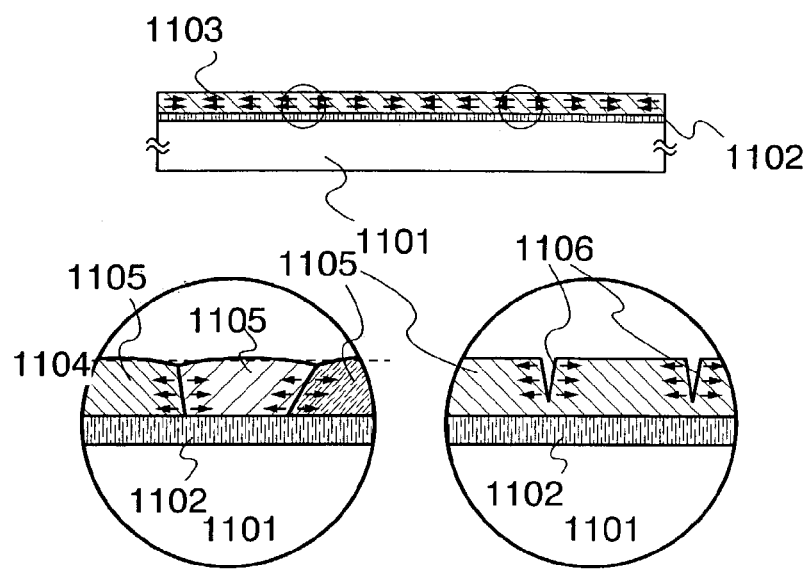
FIGS. 2A and 2B are schematic views showing a stress distribution resulting from crystallization of the semiconductor layer.
Figure 2B:
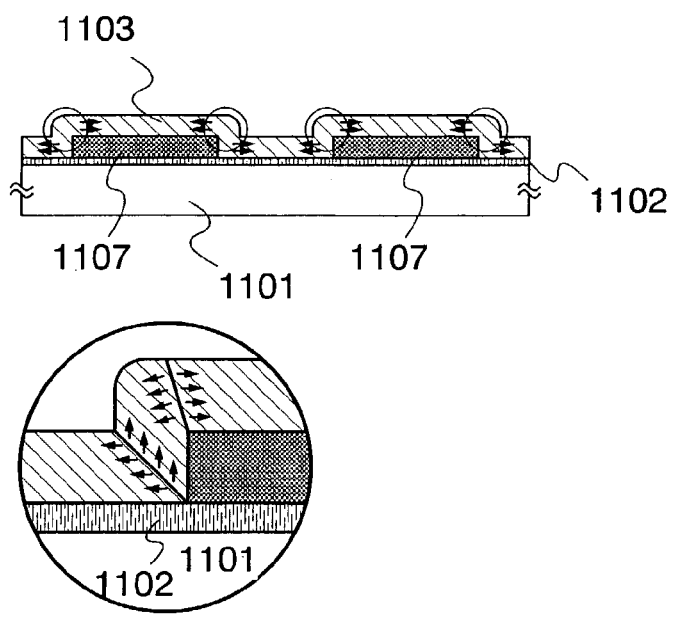
Figure 3A:
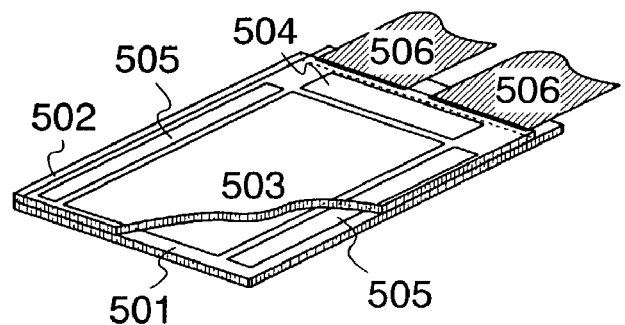
FIGS. 3A and 3B are a schematic view of a display device and a diagram showing a typical circuit configuration example of a source signal line driver circuit.
Figure 3B:
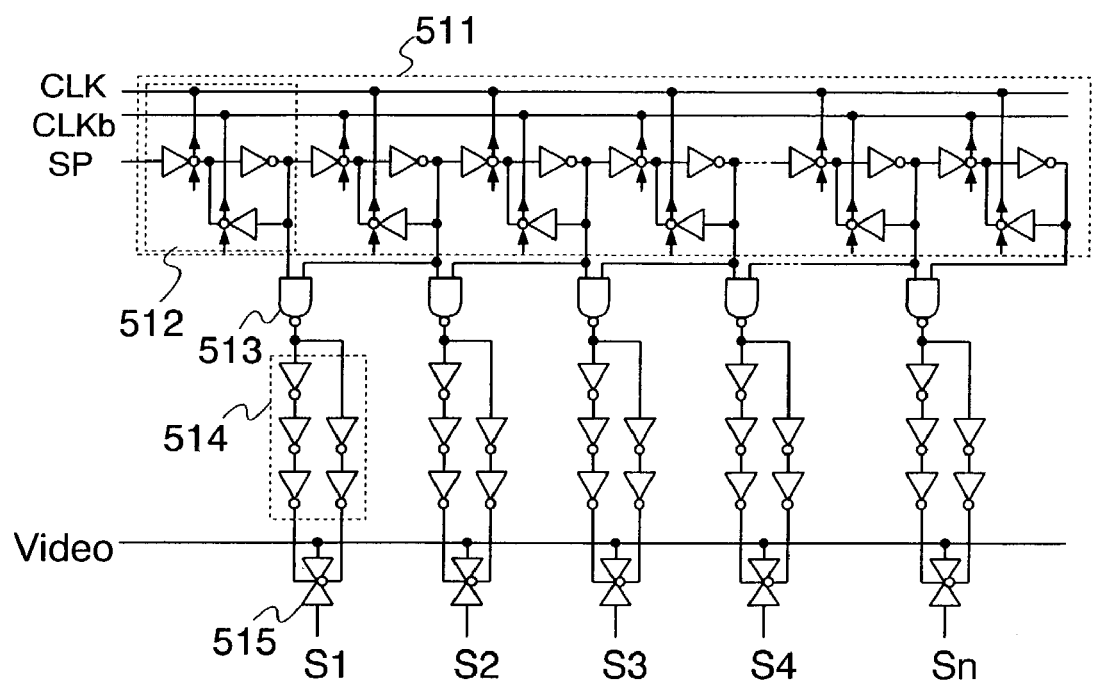
Figure 4A:
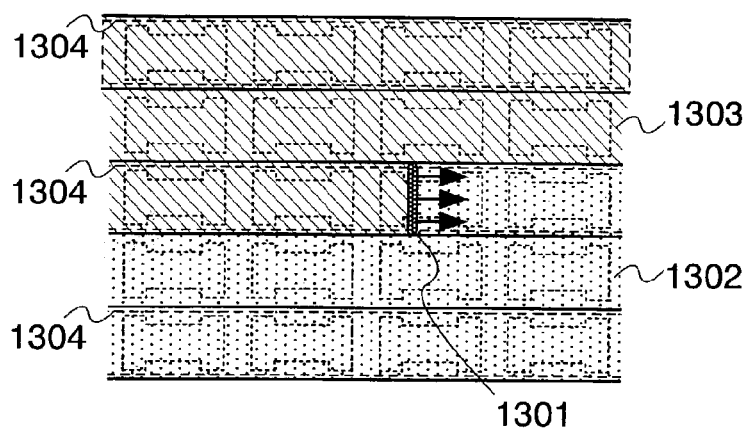
FIGS. 4A to 4C are explanatory views related to fluctuation in elements when respective TFTs are formed using a plurality of active layers having a small W in parallel.
Figure 4B:
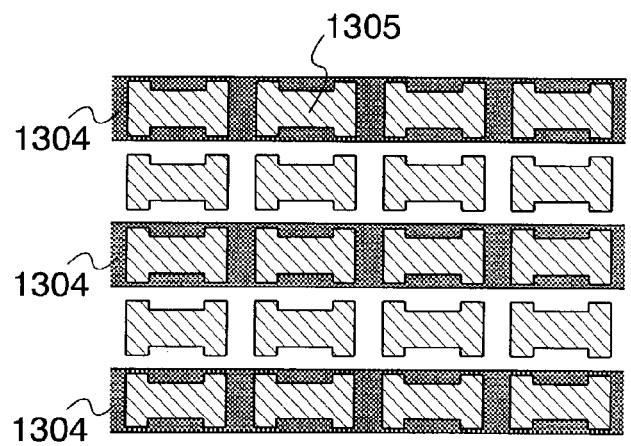
Figure 4C:
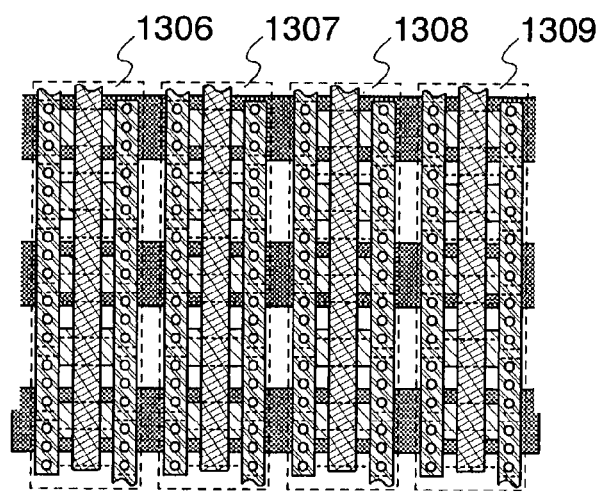
Figure 5A:
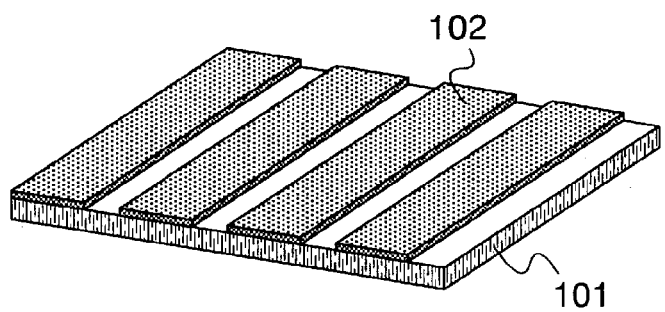
FIGS. 5A to 5D are explanatory views of an embodiment mode of the present invention.

An embodiment mode of the present invention will be described with reference to FIGS. 5A to 5C.

A base film 102 made from an insulating film such as a silicon oxide film, a silicon nitride film, or a silicon oxynitride film is formed on a substrate 101. Note that for the substrate 101, a material which is resistant to a process temperature through manufacturing of a semiconductor device is used. For example, a quartz substrate, a silicon substrate, a no alkali glass substrate made of barium borosilicate glass, aluminoborosilicate glass, or the like, a substrate in which an insulating film is formed on the surface of a metallic substrate, or the like can be used. In addition, a plastic substrate having such a heat resistance as to be resistant to a processing temperature may be used. After the base layer 102 is formed on the entire surface of the substrate, it is patterned into a slit shape to obtain the substrate surface on which groove-shaped unevenness is provided. Although not particularly shown here, a base film made from an insulating film or the like may be formed between the substrate 101 and the base layer 102.

Figure 5B:
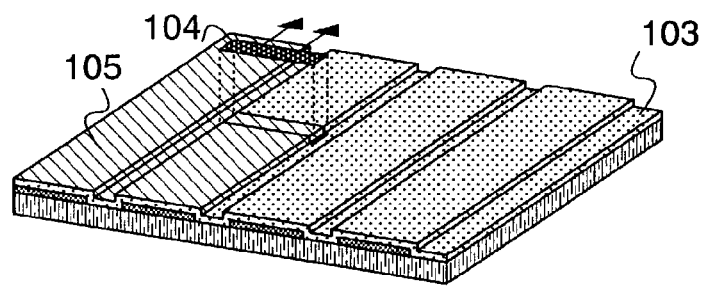

Subsequently, a semiconductor layer 103 is formed (FIG. 5B). The semiconductor film 103 is preferably formed by using a known technique (such as a sputtering method, an LPCVD method, or a plasma CVD method). In addition, the semiconductor layer 103 may be an amorphous semiconductor layer, a micro-crystalline semiconductor layer, or a polycrystalline semiconductor layer.

Then, the surface of the semiconductor layer 103 is irradiated with laser light 104 to crystalline the semiconductor layer 103. In FIG. 5B, numeral 103 denotes a non-crystallized semiconductor layer, and numeral 105 denotes a crystallized semiconductor layer. Here, in the case where the crystallization of the semiconductor layer 103 is progressed in advance to a degree (including the case where any crystallization processing is performed in a preprocess), the crytallinity is improved by this laser irradiation process. Here, a low energy density region of laser light is blocked by a slit (not shown) so that it is not incident onto the semiconductor layer. This reason is as follows. That is, when laser light having a low energy density is irradiated to the semiconductor layer to crystallize it, rearrangement to crystallization are not sufficiently conducted because of insufficient dissolution so that its crystal grain becomes a microcrystal grain of about 0.1 µm or less. Accordingly, in the case of such a crystalline semiconductor layer, superior electrical characteristics are not obtained.

Whether or not an energy density is sufficient is determined whether or not a desired crystal grain is obtained in the semiconductor layer and it is preferably determined as appropriate by a designer. Thus, when the designer determines the crystallinity is insufficient, it is determined that the energy density at this time is low.

The energy density of the laser light becomes lower in edges and their vicinities of a laser light spot obtained through the slit so that a crystal grain is small in the irradiated edges and their vicinities and protruding portions (ridges) appear along a grain boundary. Thus, it is preferable that the trail of the laser light spot (indicated by a dot line in FIG. 5B) and regions in which the island-like semiconductor layers are formed in a later process are not overlapped with each other. The alignment between a laser light irradiation position and the substrate may be conducted using makers formed in patterning of the base layer 102 or controlled by inputting mask information and a parameter such as a laser irradiation pitch to a computer or the like.

According to the present invention, a known laser can be used as a laser for irradiating laser light to the semiconductor layer. A gas laser or a solid laser which conducts pulse oscillation or continuous oscillation can be used as the laser.

With respect to the gas laser, there are an excimer laser, an Ar laser, a Kr laser, and the like. With respect to the solid laser, there are a YAG laser, a $YVO_4$ laser, a YLF laser, a $YAlO_3$ laser, a glass laser, a ruby laser, an alexandrite laser, a Ti:sapphire laser, and the like. In addition, a laser using crystal such as YAG, $YVO_4$, YLF, or $YAlO_3$, which is doped with Cr, Nd, Er, Ho, Ce, Co, Ni, or Tm is applied as the solid laser. The fundamental of the laser is changed according to a doping material, and laser light having a fundamental of about 1 µm is obtained. A harmonic to the fundamental is obtained by using a non-linear optical element.

Further, infrared laser light emitted from the solid laser is converted into green laser light by a non-linear optical element and then ultraviolet laser light obtained through conversion by another non-linear optical element can be used.

Stress produced in the inner portion of a semiconductor layer 105 by the crystallization concentrates on edge portions of the unevenness provided on the substrate 101 so that stress on the entire surface of the substrate is dispersed.

Figure 5C:
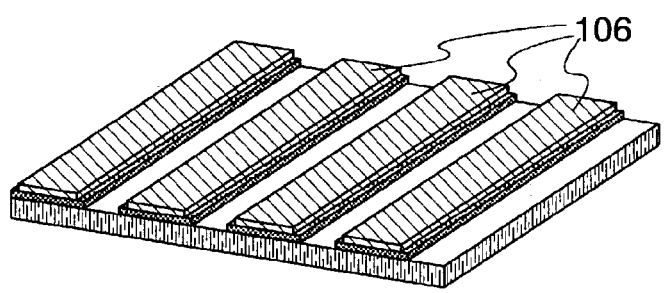

Subsequently, as shown in FIG. 5C, the crystalline semiconductor layer 105 is patterned to form island-like semiconductor layers 106 in a predetermined shape. Stress produced by the crystallization of the semiconductor layer concentrates on the edge portions of the unevenness so that the crystallinity is not preferable. Therefore, it is desirable that the island-like semiconductor layers 106 are formed in flat regions except for the edge portions of the unevenness.

Figure 6A:
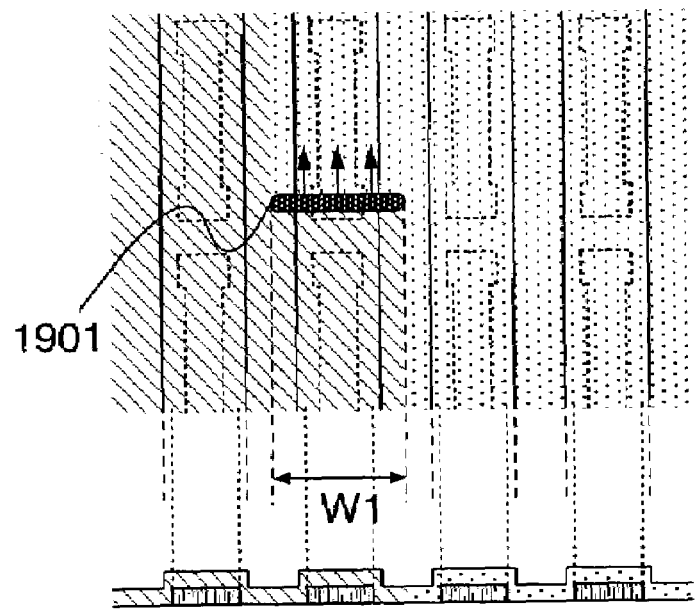
FIGS. 6A and 6B are explanatory views related to changing of an irradiation width of laser light while it is irradiated to a substrate.
Figure 6B:
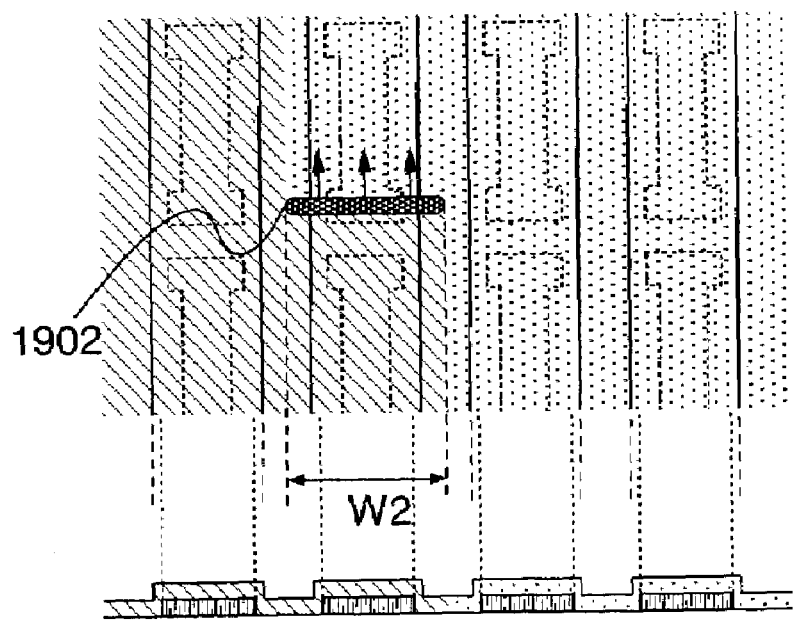

Note that a width of a beam spot can be changed as appropriate according to a width of the slit-shaped unevenness formed on the surface of the substrate. FIGS. 6A and 6B are explanatory views for the case where a width of the slit is changed and laser light is scanned across the semiconductor layer over the substrate having the slit-shaped unevenness with two kinds of widths. FIG. 6A shows a relationship between a laser light scanning region and a first island-like semiconductor layer in the case where the width of the unevenness in a direction perpendicular to a scanning direction is relatively small. FIG. 6B shows a relationship between the laser light scanning region and the first island-like semiconductor layer in the case where the width of the unevenness in the direction perpendicular to the scanning direction is relatively large.

When a width of a spot 1901 in FIG. 6A is set as $W_1$ and a width of a spot 1902 in FIG. 6B is set as $W_2$, a relationship of $W_1 < W_2$ is obtained. Of course, the widths of the spots are not limited to those and can be freely set.

Note that, according to the present invention, as shown in FIGS. 6A and 6B, laser light is not irradiated onto the entire surface of the substrate but the spot is scanned such that at least portions which become the island-like semiconductor layers later can be crystallized. Because laser light is not irradiated onto the entire surface of the substrate but irradiated to a minimum portion such that regions which become the island-like semiconductor layer can be crystallized in a preferable state, a processing time per substrate can be shortened so that the efficiency of substrate treatment can be improved.

Figure 5D:
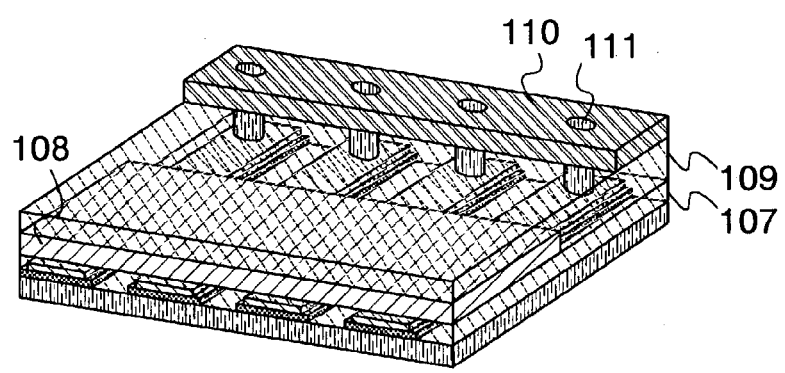

After that, a gate insulating film 107, gate electrodes 108, an interlayer insulating film 109, and a wiring 110 are formed to produce a TFT. In FIG. 5D, the wiring 110 becomes an electrode electrically connected with a source region or a drain region of the TFT.

FIGS. 7A to 7E are top views and cross sectional views which simply show a process until this stage. FIG. 7A shows a state after forming the base layer 302 as a slit shape, FIG. 7B shows a state after forming an amorphous semiconductor layer 303, FIG. 7C shows a process of laser crystallization, FIG. 7D shows a state after forming island-like semiconductor layers 306, and FIG. 7E shows a state after forming a gate insulator film 309, gate electrodes 307, an interlayer insulating film 310, and a wiring 308. In FIGS. 7A to 7E, portions surrounded by dot frames 300 correspond to the portions shown in FIGS. 5A to 5D. Note that, here, a multi-channel TFT is formed using a plurality of island-like semiconductor layers 306. However, a plurality of TFTs separately using the respective island-like semiconductor layers as active layers can be also produced.

Figure 8A:
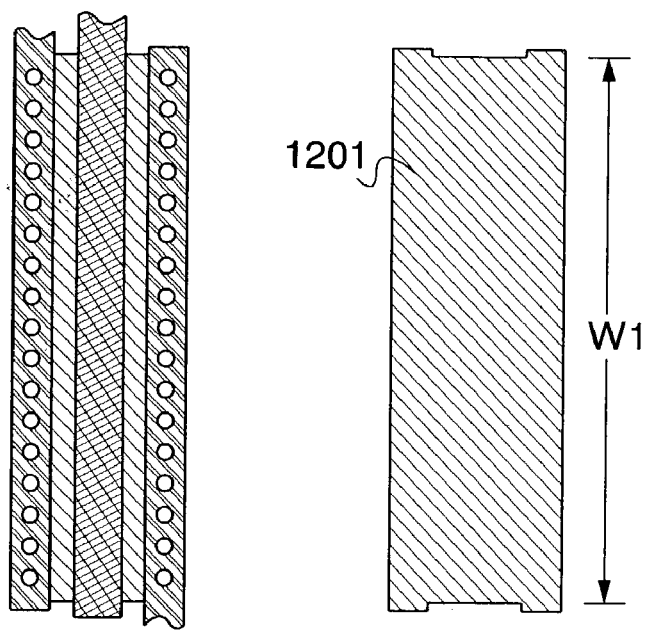
FIGS. 8A and 8B show the case where a TFT having a large W is formed using a single active layer and the case where the TFT is formed using a plurality of active layers having a small W in parallel.
Figure 8B:
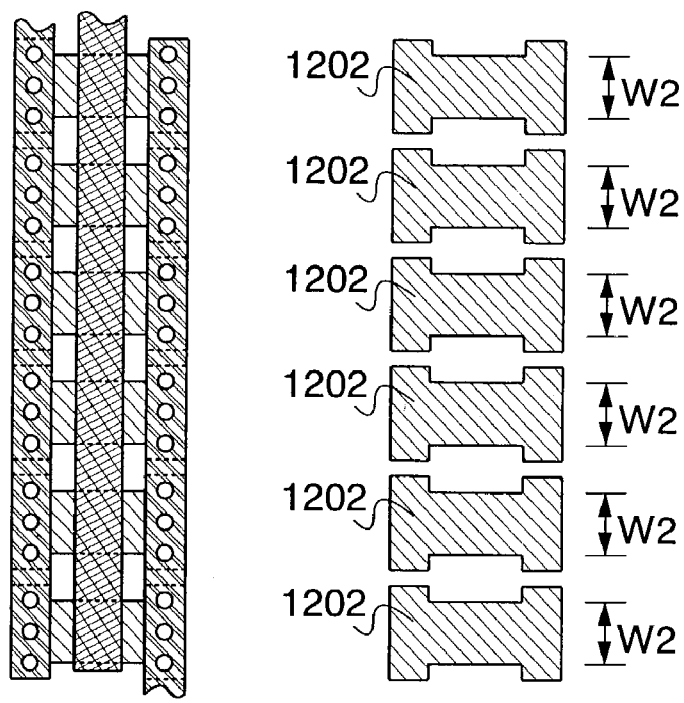

In particular, in the case of a TFT composing a circuit such as a sampling switch (analog switch) or a buffer, for which a capacity for driving a large load is required, it is necessary to increase a channel width W as shown by 1201 (FIG. 8A). However, as shown in FIG. 8B, when a plurality of active layers with a small W 1202 are used in parallel, fluctuation between the respective active layers are averaged so that a TFT with less variation can be formed.

Also, because the stress produced in the semiconductor layer by laser crystallization concentrates on the edge portions of the unevenness on the substrate, as shown in FIG. 5B, a location on which the stress is concentrated can be artificially specified by patterning of base layer 102. Thus, it can be prevented that the stress concentrates on portions used as the active layers later.

Further, in FIG. 7D, the island-like semiconductor layers 306 are arranged such that a moving direction of charges in channel formation regions and a scanning direction of laser light 305, that is, a longitudinal direction of crystal grain become parallel to each other. Thus, more preferable electrical characteristics are obtained for the TFT.

Hereinafter, embodiments of the present invention will be described.

Embodiment 1

In this embodiment, an example of a laser crystallization process using a CW laser will be described.

As a CW laser suitable to this method, a laser having a wavelength of 550 nm or less and extremely high output stability is desirable. For example, a second harmonic of a $YVO_4$ laser, a second harmonic of a YAG laser, a second harmonic of a YLF laser, a second harmonic of a glass laser, a second harmonic of a $YAlO_3$ laser, an Ar laser, and the like are suitable. Alternatively, a higher order harmonic of these lasers may be used. Alternatively, a laser such as a ruby laser, an alexandrite laser a Ti:sapphire laser, a continuous oscillation excimer laser, a Kr laser, a $CO_2$ laser, a continuous oscillation helium cadmium laser, a copper vapor laser, or a gold vapor laser may be used. Further, a plurality of or plural kinds of lasers as described above can be used.

Figure 9:
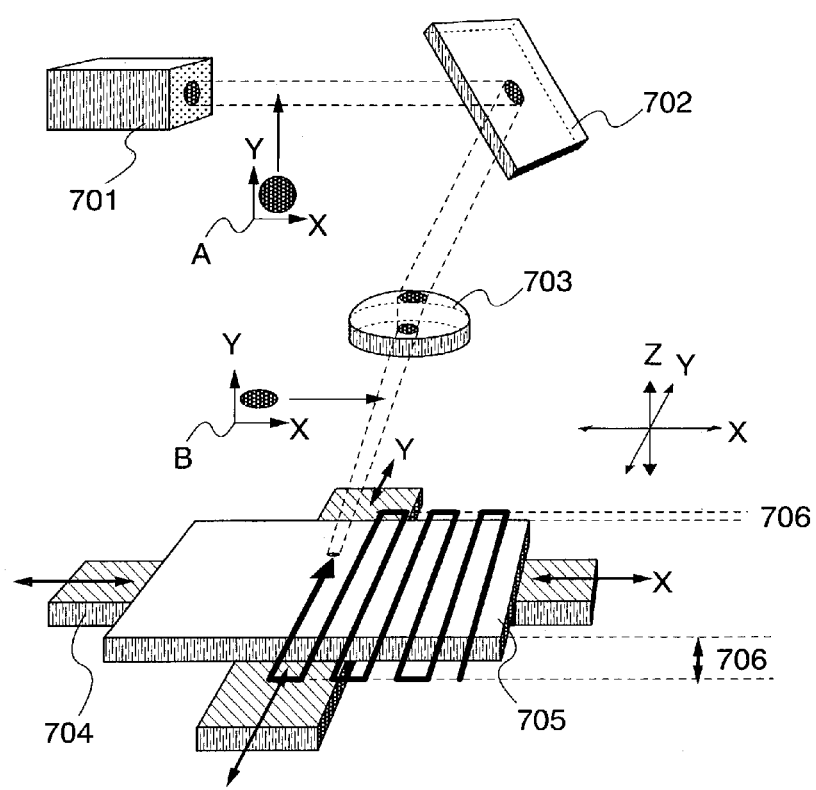
FIG. 9 is a schematic diagram for a laser irradiation process.

FIG. 9 schematically shows an apparatus for conducting CW laser crystallization, which is composed of a laser oscillator 701, a mirror 702, a convex lens 703, an X-Y stage 704, and the like. The laser used here is a continuous oscillation $YVO_4$ laser having an output of 10 W. The laser oscillator 701 includes a non-linear optical element and emits a second harmonic from an outlet.

A laser beam emitted from the laser oscillator 701 is made in a circular shape as indicated by reference symbol "A" in FIG. 9. The laser beam is emitted in a horizontal direction and deflected to a direction slanted at about 20° from a vertical direction by the mirror 702. After that, it is condensed by the convex lens 703 located in a horizontal direction. A substrate 705 is held on the X-Y stage 704 and the convex lens 703 is focused onto an irradiation surface of a semiconductor layer formed on the substrate. At this time, the substrate is located such that the irradiation surface becomes parallel to the convex lens 703. In other words, the substrate 705 is horizontally located. The laser beam is incident into the convex lens 703 at an angle of about 20°. Thus, the laser beam light on the irradiation surface has an elliptical shape by the astigmatism of the convex lens. A beam shape on the irradiation surface is determined according to an incident angle into the convex lens 703. Therefore, when the laser beam is made incident into the convex lens at a larger angle about the vertical direction, it can be made to an elliptical shape with a larger aspect ratio. However, a focal depth becomes shallow so that uniform irradiation is difficult. Accordingly, it is suitable that-a deflection angle is about 20°.

In order to crystallize the semiconductor layer on the entire surface of the substrate, it is necessary to repeat scanning on the substrate while an elliptical beam is shifted in its longitudinal direction at a suitable irradiation pitch. According to this operation, a laser output unit which is composed of the laser oscillator 701, the mirror 702, and the convex lens 703 is held and the substrate is moved using the X-Y stage 704 such that the elliptical beam is scanned on the substrate. A size of the substrate as an irradiated object is assumed to 600 mm in an X-direction and 720 mm in a Y-direction in FIG. 9 and a longitudinal length of the elliptical beam is assumed to 200 μm. In this case, when scanning is conducted in a direction as shown in FIG. 9, laser irradiation can be conducted on the entire surface of the substrate whose size is 126.6 mm×126.6 mm by scanning 3000 times (1500 times for round-trip scanning).

It is necessary to scan the laser light spot on the substrate at a uniform speed. Thus, as shown in FIG. 9, acceleration and deceleration intervals 706 are provided in regions where laser light is not irradiated onto the substrate. The output of the laser oscillator 701 may be stopped in the intervals.

Also, although it will be described in detail in a later embodiment, when a plurality of laser oscillators are used and a plurality of elliptical beams are arranged in a longitudinal direction and scanned in parallel, it is possible that the number of performing scanning is reduced and a processing time is shortened. Thus, low energy density regions of both end portions of respective adjacent single laser light beams are overlapped with each other so that the energy density can be increased. Therefore, an effective irradiation region can be widened and a ratio of an effective irradiation region to a single irradiation region can be increased so that a limitation in circuit layout can be minimized.

Note that this embodiment can be embodied by being combined with other embodiments.

Embodiment 2

In this embodiment, an example in which deflection of laser beam is conducted using an optical system different from that in Embodiment 1 will be described with reference to FIG. 10.

Figure 10:
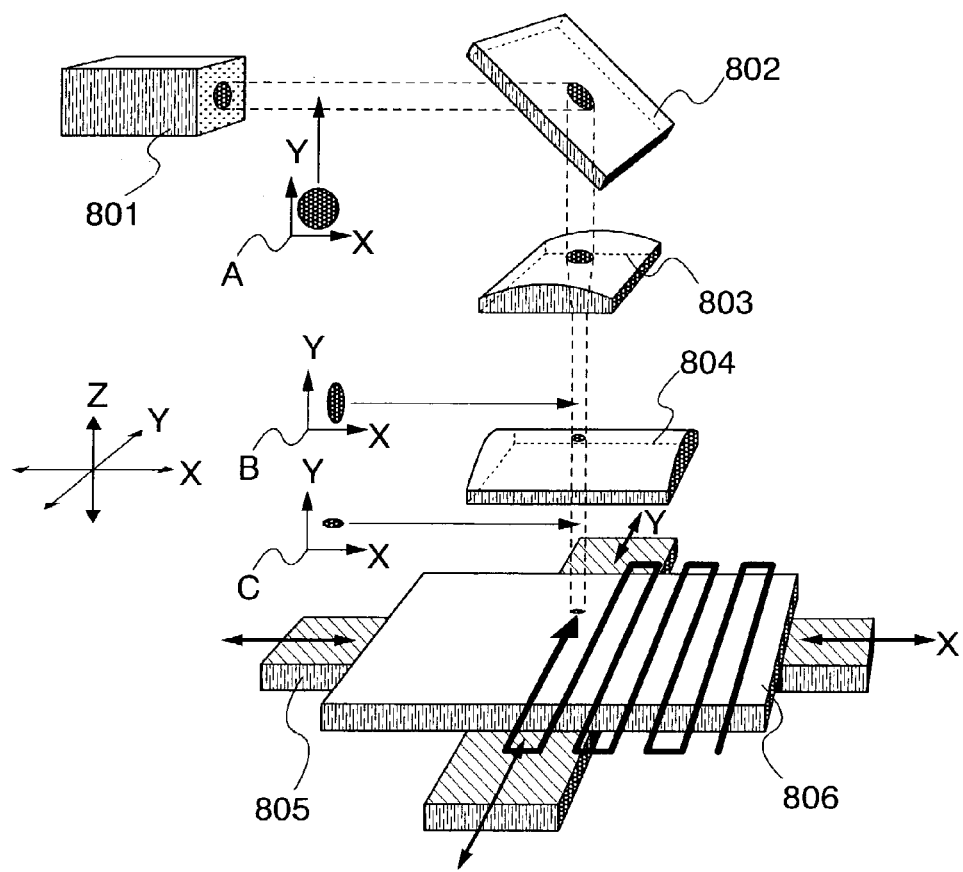
FIG. 10 is a schematic diagram fort a laser irradiation process.

A laser beam emitted from a laser oscillator 801 is made in a circular shape as indicated by reference symbol "A" in FIG. 10. The laser beam is emitted in a horizontal direction and deflected to a vertical direction by a mirror 802. After that, the beam is condensed in an X-direction by a first cylindrical lens 803. At this time, as indicated by reference symbol "B" in FIG. 10, the circular shape of the beam becomes an elliptical shape with a longitudinal axis of a Y-direction while being condensed in the X-direction. Subsequently, the beam is condensed in the Y-direction by a second cylindrical lens 804. At this time, as indicated by reference symbol "C" in FIG. 10, the shape of the beam becomes an elliptical shape with a longitudinal axis of the X-direction while being condensed in the Y-direction. When such an optical system is used, an ellipse-shaped beam having a larger aspect ratio than that indicated in Embodiment 2 can be obtained. After that, the beam is irradiated into the substrate 806 held on the X-Y stage 805. Laser beam scanning on the substrate is preferably conducted as in Embodiment 1.

Figure 12A:
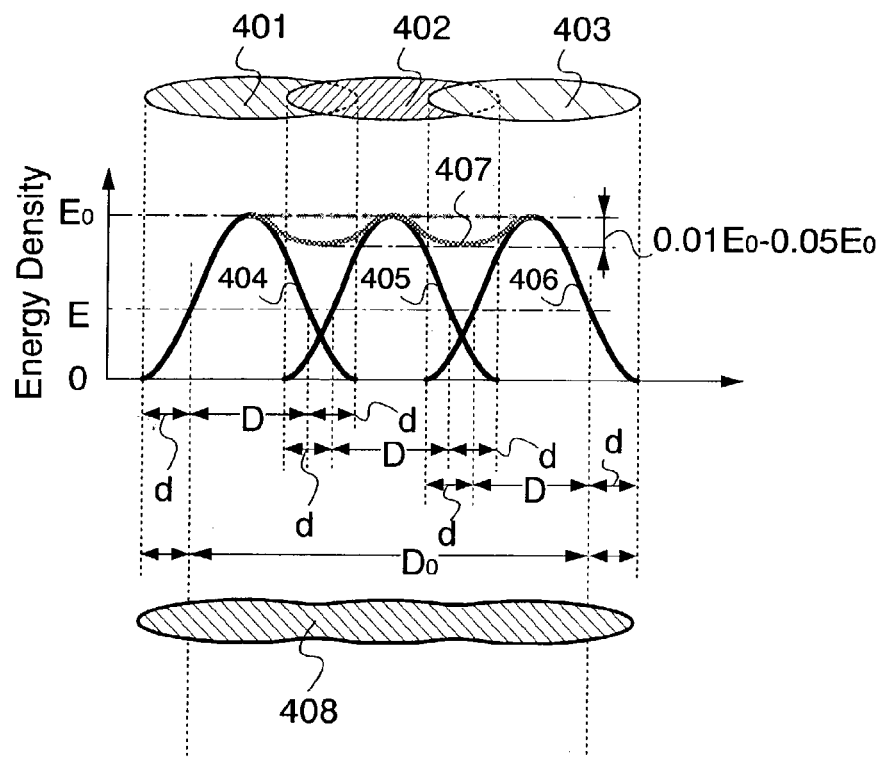
FIGS. 12A and 12B are explanatory views of the case where a synthesized laser light spot is produced from a plurality of laser light spots.
Figure 12B:
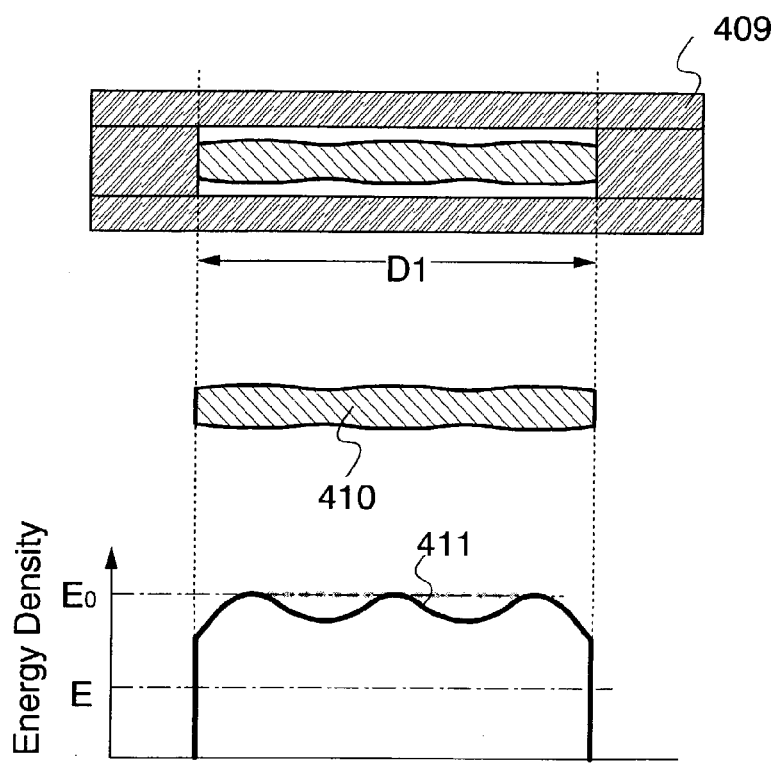

Also, when a plurality of laser oscillators are used and a plurality of elliptical beams are arranged in a longitudinal direction and scanned in parallel as shown in FIGS. 12A and 12B, it is possible that the number of performing scanning is reduced and a processing time is shortened. Thus, low energy density regions of both end portions of respective adjacent single laser light beams are overlapped with each other so that the energy density can be increased. Therefore, an effective irradiation region can be widened so that a limitation in circuit layout can be minimized.

Note that this embodiment can be embodied by being combined with other embodiments.

Embodiment 3

When a semiconductor layer is crystallized according to the process described in the embodiment mode using a CW laser, a shape of laser light on a surface to be irradiated, which is oscillated from a single laser oscillator, is an elliptical shape or a rectangular shape. In addition, in order to increase an energy density on an irradiation surface, laser light is narrowed in a spot shape so that an irradiation range as shown in FIG. 11A is obtained.

In the laser light narrowed in the spot shape, there is a distribution in energy density. An energy distribution in an X-cross section, that is, in a longitudinal direction of the ellipse in FIG. 11.

Figure 11:
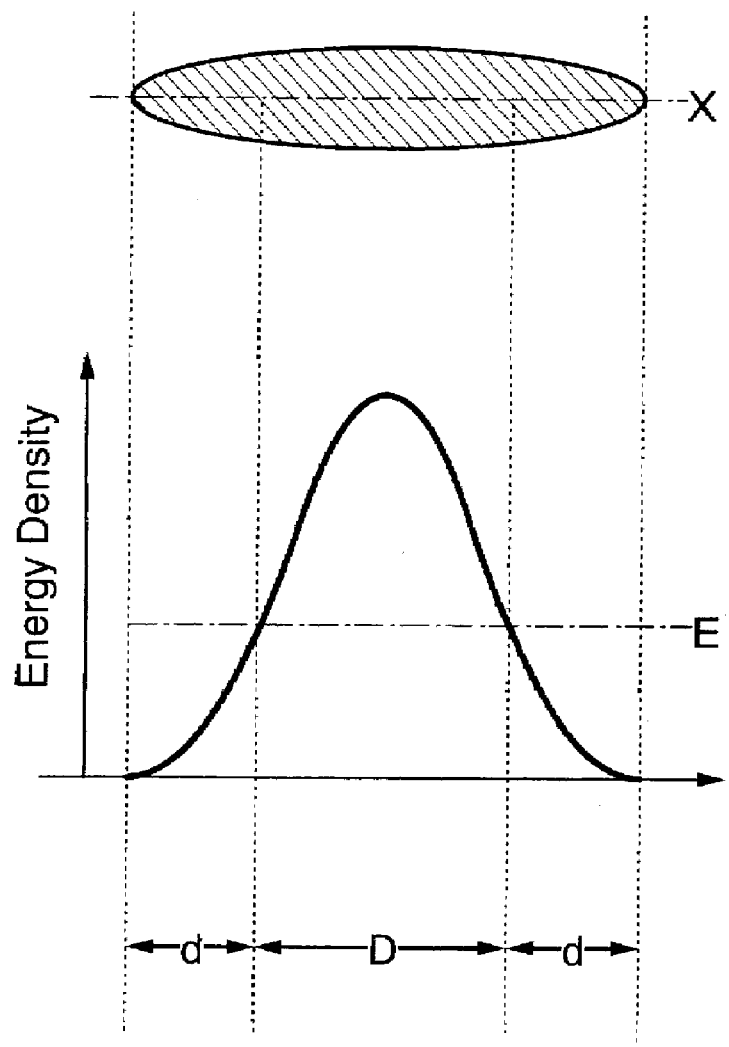
FIG. 11 is an explanatory view showing a laser light spot and its energy density distribution.

As shown in FIG. 11, the laser light spot has a distribution in which an energy density is gradually decreased from a central region to end regions. Here, assume that reference symbol "E" denotes a minimum energy density required for crystallizing a semiconductor layer in a preferable state. In this case a semiconductor layer to which laser light with a range indicated by reference symbol "D" is irradiated is crystallized in a preferable state and thus has superior electrical characteristics. However, a semiconductor layer to which laser light with a range indicated by reference symbol "d" is irradiated is not sufficiently melted because of an insufficient energy density of laser light so that it is microcrystallized. In such a region, sufficient electrical characteristics are not obtained. Thus, it is not suitable that the semiconductor layer is used as an active layer.

When a plurality of TFTs are produced using semiconductor layers obtained by patterning a single first island-like semiconductor layer according to the present invention, it is desirable that the range indicated by "D" in FIG. 11 is wider. However, there is a limitation to the increase in a laser light spot size. Thus, when a circuit is constructed with the limited width, a layout of an element becomes difficult. As a result, a lead of wiring or the like becomes longer so that an ineffective circuit layout is made.

Therefore, according to this embodiment, an example of a method of conducting an effective laser irradiation using laser light beams emitted from a plurality of laser oscillators will be described.

Reference is made on FIGS. 12A and 12B. Reference numerals 401 to 403 respectively denote laser light spots obtained by condensing laser light beams outputted from three different laser oscillators in a spot shape using an optical system. The respective laser light spots 401 to 403 are synthesized such that longitudinal axes of respective ellipses are aligned on a line and portions of the respective laser light spots are overlapped with each other. Thus, a single laser light spot is obtained.

FIG. 12A shows energy density distributions 404 to 406 of the respective laser light spots 401 to 403 in the longitudinal direction. The energy densities of the respective spots are equal to each other and a peak value is indicated by $E_0$. With respect to the synthesized laser light spot, energy densities in overlapped regions are added, thereby obtaining an energy density distribution as indicated by reference numeral 407.

At this time, with respect to an overlapped region of the adjacent spots 404 and 405 and an overlapped region of the adjacent spots 405 and 406, energy densities of the two spots are added so that an energy density enough to crystallize a semiconductor layer in a preferable state is obtained. Thus, a spot shape after the synthesization becomes a shape indicated by reference numeral 408. In this spot, a range capable of crystallizing a semiconductor layer in a preferable state becomes $D_0$.

Note that, it is ideal that a sum of energy densities in an overlapped region of the adjacent spots becomes equal to the peak value $E_0$ of a single spot (indicated by a wide dot line). However, an overlapping width of the spots is preferably set as appropriate such that it becomes a value in a range capable of uniformly crystallizing a semiconductor layer in a preferable state within a range of $D_0$. Note that, specifically, it is preferable that a difference between an energy density and the peak value $E_0$ within the range indicated by $D_0$ is made to ±5% or less. More preferably, it is desirable that the difference is made to ±1% or less As is apparent from FIG. 12A, when the plurality of laser light spots are overlapped to compensate low energy density regions, laser irradiation with a wider width is possible.

Referring to FIG. 11 again, when the synthesized laser light spot is used, not only scanning on a wide area is possible but also it is advantageous with respect to the efficiency. When single laser light is used, a width of an irradiation region is (D+2d). In addition, when a synthesized laser light spot as shown in FIG. 12A is used, a width of an irradiation region is ($D_0$+2d). A ratio of a width capable of conducting preferable crystallization to one scanning width of the laser light spot becomes (D/(D+2d)) in the former and ($D_0$/($D_0$+2d)) in the latter. Thus, because of D<$D_0$, it is said that preferable crystallization can be efficiently conducted.

Also, with respect to the synthesized laser light spot, it is more preferable that the low energy density regions located in both edges in the longitudinal direction are shielded by using a slit 409 as shown in FIG. 12B so as not to be incident into a semiconductor layer. At this time, a spot shape on the surface of the semiconductor layer becomes a shape as shown by reference numeral 410, that is, a shape which has a width of $D_1$ (<$D_0$) in the longitudinal direction and is close to a rectangular shape.

In the laser light spot having such a shape, which is irradiated to the semiconductor layer, no low energy density regions exists. Alternatively, even if it exists, because its width is extremely small as compared with the case where the slit is not used, it becomes easier to control a spot position so as not to scan irradiation end portions of the laser light spot on a first island-like semiconductor layer. Thus, a scanning path of the laser light can be shortened and a limitation in layout of the first island-like semiconductor layer or a second island-like semiconductor layer can be reduced.

Further, when the slit is used, the width of the laser light spot can be changed without stopping the outputs of the laser oscillators while the energy density is kept constant. In addition, an effect in which a damage to a substrate, resulting from laser light irradiation to an unnecessary region on the substrate is prevented can be expected.

Embodiment 4

Figure 13A:
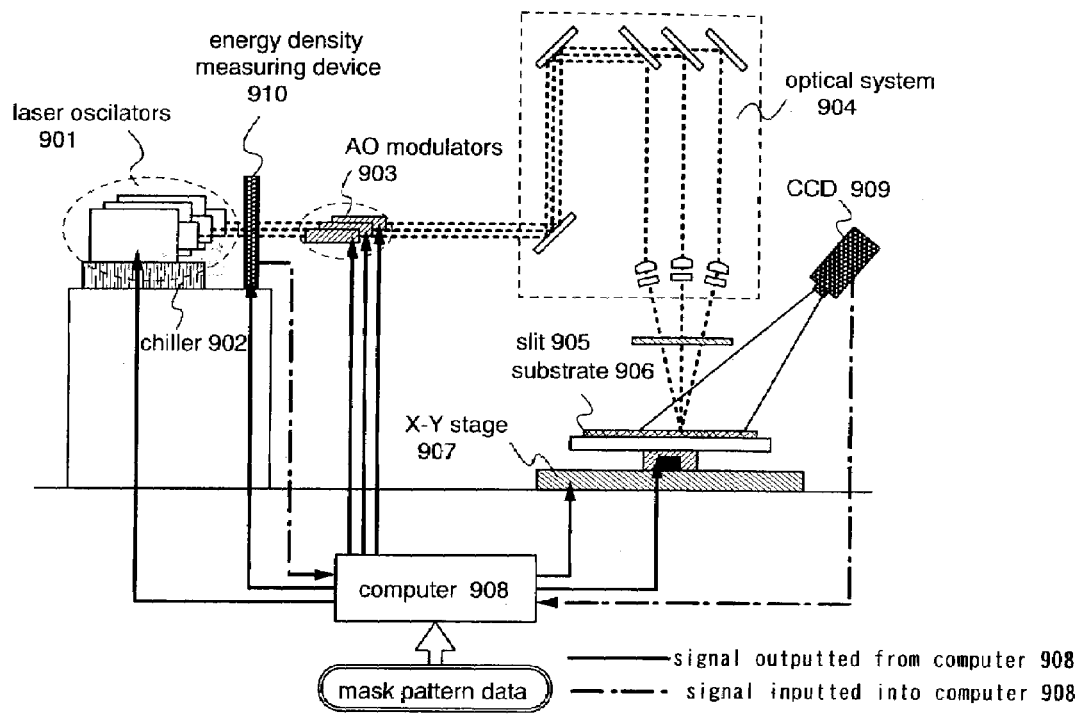
FIGS. 13A and 13B are schematic diagrams of a laser irradiation apparatus including a control system.

A configuration including a control system of a laser irradiation apparatus used in the present invention will be described using FIG. 13A. Reference numeral 901 denotes laser oscillators. In FIG. 13A, three laser oscillators are used. The number of laser oscillators in the laser irradiation apparatus is not limited to three.

The laser irradiation apparatus shown in FIG. 13A includes a computer having both a central arithmetic and processing unit and memory means such as a memory. The computer 908 can control the oscillation of the laser oscillators 901, and move a substrate 906 to a predetermined position such that a region specified according to pattern information of a mask is covered with laser light spot, in order to control an irradiation position of the laser light spot to the substrate.

Note that a temperature of the laser oscillators 901 may be kept constant using a chiller 902. The chiller 902 is not necessarily provided. However, when the temperature of the laser oscillators 901 is kept constant, variations can be suppressed in the energy of outputting laser light according to the temperature.

Also, reference numeral 904 denotes an optical system, which can change paths of light spots outputted from the laser oscillators 901 and process a shape of laser light spots to condense laser light. Further, according to the laser irradiation apparatus shown in FIG. 13A, laser light spots outputted from the plurality of laser oscillators 901 are overlapped with each other by the optical system 904 so that they are synthesized.

Note that AO modulators 903 capable of temporarily and completely blocking laser light beams may be provided on optical paths between the substrate 906 as an object to be processed and the laser oscillators 901. In addition, attenuators (light amount adjusting filters) may be provided instead of the AO modulators 903 to adjust the energy densities of laser light beams.

Also, means for measuring energy densities (energy density measuring means) 910 of laser light beams outputted from the laser oscillators 901 may be provided on the optical paths between the substrate 906 as an object to be processed and the laser oscillators 901 to monitor change over time in measured energy densities by the computer 908. In this case, the outputs from the laser oscillators 901 maybe increased so as to compensate the attenuation of the energy densities of the laser light beams.

The synthesized laser light spot is irradiated to the substrate 906 as the object to be processed through the slit 905. It is desirable that the slit 905 is made of a material which can block the laser light and is not deformed or damaged by the laser light. In addition, with respect to the slit 905, its slit width is variable. Thus, the width of the laser light spot can be changed according to the slit width.

Note that, when laser irradiation is conducted without passed through the slit 905, the shape of the laser light spots oscillated from the laser oscillators 901 on the substrate 906 is changed according to a kind of laser and can be also formed by an optical system.

The substrate 906 is located on an X-Y stage 907. In FIG. 13A, the X-Y stage 907 is controlled by the computer. The irradiation position of the laser light spot is controlled by moving the object to be processed, that is, the substrate 906.

Further, according to the present invention, the width of the slit 905 can be controlled by the computer 908 to change the width of the laser light spot according to the pattern information of the mask.

Further, the laser irradiation apparatus shown in FIG. 13A may include means for controlling a temperature of the object to be processed. In addition, because the laser light has high directivity and a high energy density, a damper may be provided to prevent reflected light from irradiating to an improper location. It is desirable that the damper has a property in which the reflected light is absorbed. A cooling water may be circulated in the damper to prevent a temperature of an isolation wall from rising by absorption of the reflected light. Means for heating the substrate 906 (substrate heating means) may be provided to the X-Y stage 907.

Note that, when an alignment maker is formed by a laser, a laser oscillator for maker may be provided. In this case, the oscillation of the laser oscillator for maker may be controlled by the computer 908. Further, when the laser oscillator for maker is provided, an optical system for condensing laser light outputted from the laser oscillator for maker is separately provided. With respect to a laser used in forming the maker, there are, typically, a YAG laser, a $CO_2$ laser, and the like. Of course, it is possible to form the maker using another laser.

For alignment using the maker, a CCD camera 909 or a plurality of CCD cameras if need may be provided.

The alignment may be conducted by the CCD camera 909 without providing the maker. In this case, position information of the substrate can be obtained by checking pattern information related to an island-like semiconductor layer formed using the mask, which is inputted to the computer 908, and information taken by the CCD camera 909. In this case, it is unnecessary to separately provide the maker.

Figure 13B:
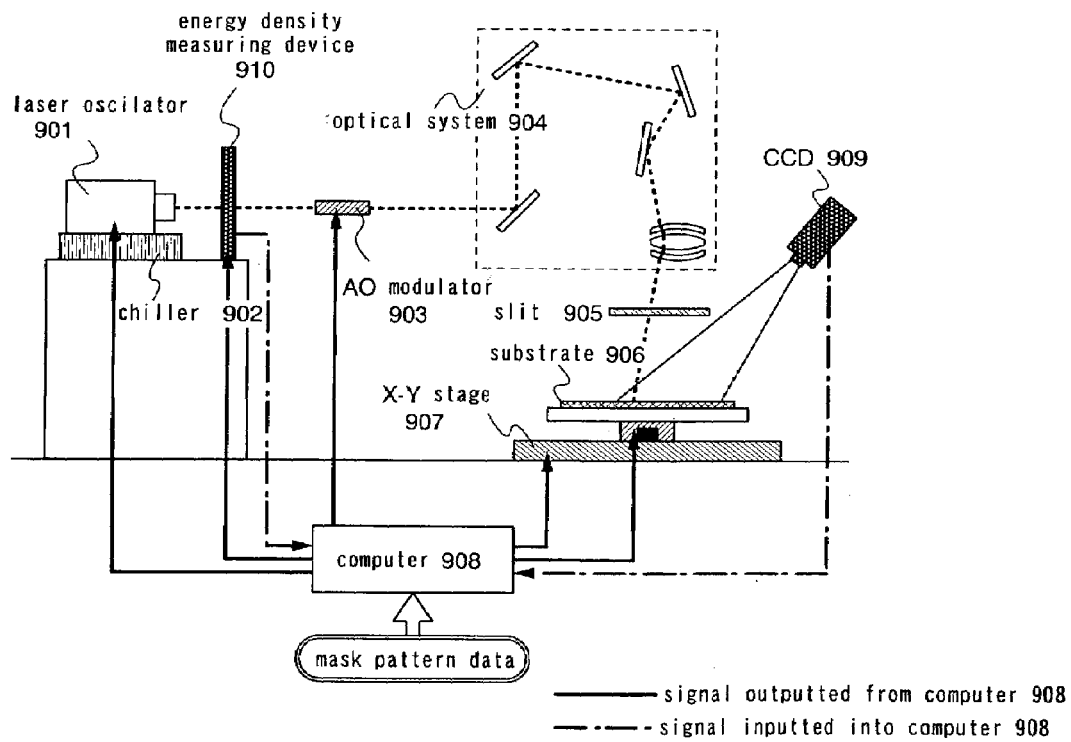

The configuration of the laser irradiation apparatus in which the plurality of laser oscillators are provided is described in FIG. 13A, but a single laser oscillator may instead be provided. FIG. 13B shows a configuration of a laser irradiation apparatus in which a single laser oscillator is used. In FIG. 13B, reference numeral 901 denotes a laser oscillator and 902 denotes a chiller. In addition, reference numeral 910 denotes an energy density measuring device, 903 denotes an AO modulator, 904 denotes an optical system, 905 denotes a slit, and 909 denotes a CCD camera. The substrate 906 is located on the X-Y stage 907 and the irradiation position of the laser light spot to the substrate 906 is controlled. As the configuration shown in FIG. 13A, the operations of the respective means in the laser irradiation apparatus are controlled by the computer 908. A point in which the number of laser oscillators is one is different from FIG. 13A. Thus, as is different from the case shown in FIG. 13A, it is sufficient that the optical system 904 has a function for condensing a single laser light beam.

Embodiment 5

In this embodiment, circuit layouts on substrates, CW laser irradiation directions, and the like will be described with reference to some examples.

Figure 14A:
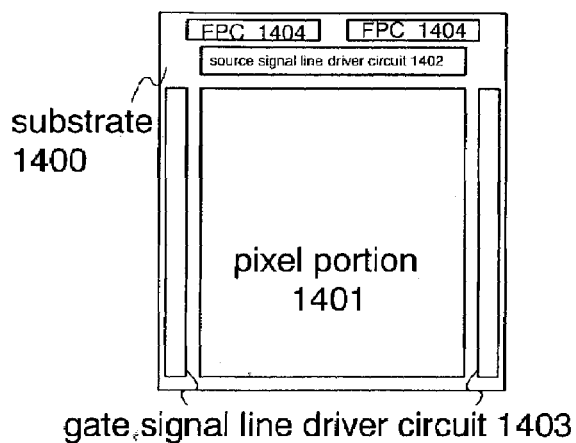
FIGS. 14A to 14E are explanatory views showing examples of a laser light scanning direction on a substrate.

Generally, a display device is configured as an example shown in FIG. 14A. The general example display device is configured to include a pixel portion 1401 in a central portion of a substrate 1400; a source-single-line drive circuit 1402 in an upper or lower portion of the pixel portion 1401; and a gate-signal-line drive circuit 1403 in either left or right portions of the pixel portion 1401 or in both of the left and right portions of the pixel portion 1401. A signal and power for driving the each drive circuit is input via a flexible print circuit (FPC) 1404 from the outside of the substrate.

Figure 14B:
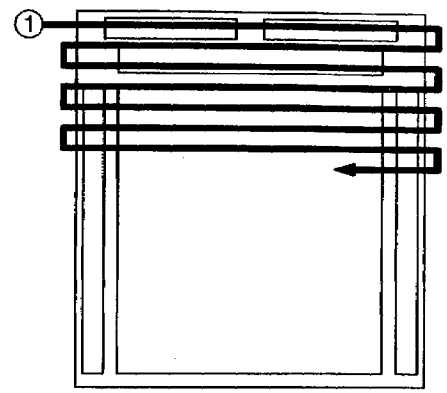

As shown in FIG. 14A, the source-single-line drive circuit 1402 is disposed extending in a pixel-column direction, and the gate-signal-line drive circuit 1403 is disposed extending in a pixel-line direction. Therefore, in a case where CW laser irradiation is performed as described in the embodiment mode, when the irradiation direction is aligned along the disposition direction of the scan-line drive circuit 1402, as shown in FIG. 14B, the irradiation direction of the CW laser is not aligned to the disposition direction of the gate-signal-line drive circuit 1403. Generally, however, in comparison with a source-signal-line drive circuit for which high-speed driving is required, the driving frequency of a gate-signal-line drive circuit may be about one-several hundredth. Accordingly, even if active layers of TFTs constituting the gate-signal-line drive circuit are formed to include portions of microcrystalline semiconductor layers, it can be said that no problems would occur with the circuit operation.

Figure 14C:
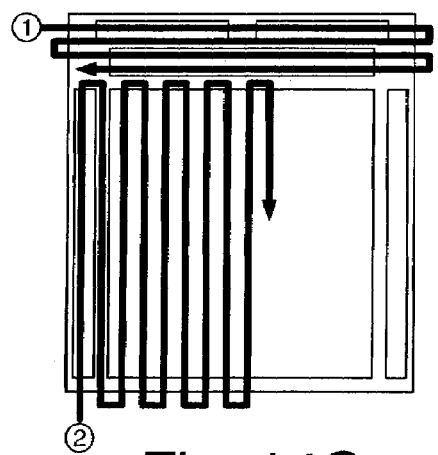

FIG. 14C illustrates another usable method in which the scanning direction is shifted during laser irradiation. Specifically, according to the method, first laser scanning is first performed in alignment with the source-signal-line drive circuit. Then, a stage on which the substrate is fixed is rotated 90 degrees, the laser scanning direction is thus changed, and second CW laser irradiation is then performed in alignment to the gate-signal-line drive circuit and the pixel portion.

Figure 14D:
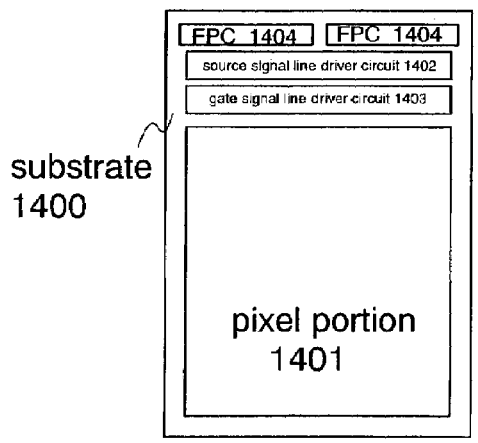
Figure 14E:
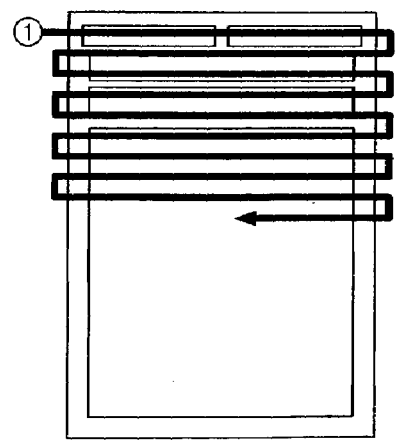

FIG. 14D illustrates still another usable method using a technique disclosed in Japanese Patent Application No. 2001-241463. In this case, a source-single-line drive circuit 1402 and a gate-signal-line drive circuit 1403 are either disposed on one side of a pixel portion or are disposed parallel to each other on the opposing two sides of the pixel portion. As a result, as shown in FIG. 14E, crystallization can be completed by one-time CW laser irradiation; and concurrently, the pixel portion and a semiconductor layer in a drive circuit can be configured only by unidirectional laser-light irradiation.

The above methods in this embodiment have been described only by way of examples, and various other methods may be employed. For example, a method may be used in which only a drive circuit portion for which high-speed driving is required is crystallized by the laser-light irradiation, and a pixel portion and the like for which the requirement level for high-speed driving is relatively low are manufactured using a conventional crystallization method. Meanwhile, this embodiment may be implemented in combination with other embodiments.

Embodiment 6

In this embodiment, a method of manufacturing an active matrix substrate will be described with reference to FIGS. 15 and 16. A substrate on which a CMOS circuit, a driver circuit, and a pixel portion having a pixel TFT and a holding capacity are formed together is called active matrix substrate for convenience.

First of all, a substrate 5000 formed of glass such as barium borosilicate glass and aluminum borosilicate glass is used in this embodiment. The substrate 5000 may be a quartz substrate, a silicon substrate, a metal substrate or stainless substrate, which has an insulating film on the surface. The substrate 5000 may be a plastic substrate having heat resistance, which withstands a processing temperature in this embodiment.

Next, a base insulating film 5001 made of an insulating film such as a silicon oxide film, silicon nitride film, and a silicon oxynitride film is formed on the substrate 5000 by publicly known method (such as the sputtering method, LPCVD method and plasma CVD method). In this embodiment, a two-layer structure composing base insulating films 5001a and 5001b is used for the base insulating film 5001. However, a structure may be used where a single layer film, which is the insulating film itself, or at least two layers are stacked.

Further next, a base layer 5002 made of an insulating film such as a silicon oxide film, silicon nitride film, or a silicon oxynitride film is formed on the base insulating film 5001 by publicly known method (such as the sputtering method, LPCVD method and plasma CVD method) with a thickness of 30 to 300 nm, then, the base layer 5002 is patterned to a slit shape with a width of 1 to 10 μm.

Here, regarding the base insulating film 5001 and the base layer 5002, it is set as a combination of a material by which the base layer 5002 is not eroded during the etching processing of the base insulating film 5002. For example, when a silicon nitride film is used for the base insulating film 5001, a silicon oxide film or the like may be used for the base layer 5002.

Figure 15A:
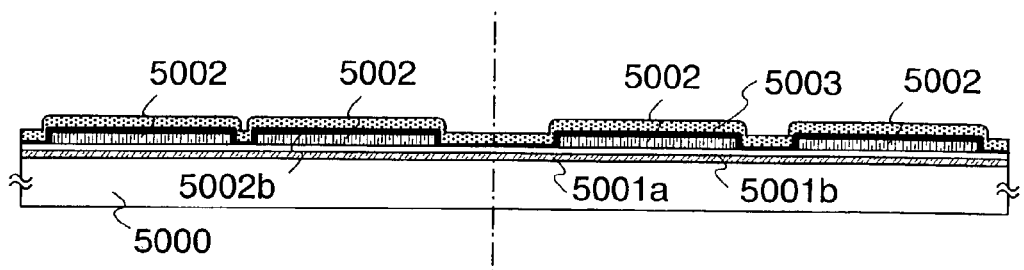
FIGS. 15A to 15E are explanatory views showing steps of manufacturing a semiconductor device.

Subsequently, an insulating film 5002b is formed to cover the base insulating film 5001 and the base layer 5002, a semiconductor layer 5003 is formed with a thickness of 30 to 200 nm (preferably 30 to 60 nm) by publicly known method (such as the sputtering method, LPCV method, plasma CVD method and the like) by continuous formations thereafter. In addition, the semiconductor layer may be an amorphous semiconductor layer, a microcrystal semiconductor layer, or a crystalline semiconductor layer. Alternatively, the semiconductor layer may be a compound semiconductor layer having an amorphous structure such as an amorphous silicon germanium film. (FIG. 15A)

Then, the semiconductor layer 5003 is crystallized by laser crystallization method. The laser crystallization method is performed by using the laser apparatus of the present invention. The laser crystallization method is conducted by using the laser irradiation method described in Embodiment Mode and Embodiments 1 to 5. Specifically, irradiates the semiconductor layer 5003 entirely or a position where an island-like semiconductor layer is formed later while scanning a laser beam spot 5004 in a direction parallel to a rill unevenness according to the mask information inputted to a computer of the laser irradiation apparatus. Of course, in addition to the laser crystallization method, the semiconductor layer may be crystallized by combining other publicly known crystallization method (such as thermal crystallization method using RTA or a furnace annealing and thermal crystallization method using a metal element facilitating the crystallization).

When a crystallization of a semiconductor layer is conducted, it is preferable that the second harmonic through the fourth harmonic of basic waves is applied by using the solid state laser which is capable of oscillating continuously in order to obtain a crystal in large grain size. Typically, it is preferable that the second harmonic (with a wavelength of 532 nm) or the third harmonic (with a wavelength of 355 nm) of an Nd:YVO$_4$ laser (basic wave of 1064 nm) is applied. Specifically, laser beams emitted from the continuous oscillation type YVO$_4$ laser with 10 W output is converted into a harmonic by using the non-linear optical elements Also, a method of emitting a harmonic by applying crystal of YVO$_4$ and the non-linear optical elements into a resonator is available. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 0.1 to 10 MW/cm$^2$) is required. The substrate 5000 on which semiconductor film is formed is moved at approximately 10 to 2000 cm/s rate relatively corresponding to the laser beams so as to irradiate the semiconductor film.

Note that, a gas laser or solid-state laser of continuous oscillation type or pulse oscillation type can be used. The gas laser such as an excimer laser, Ar laser, Kr laser and the solid-state laser such as YAG laser, YVO$_4$ laser, YLF laser, YAlO$_3$ laser, glass laser, ruby laser, alexandrite laser, Ti:sapphire laser can be used as the laser beam. Also, crystals such as YAG laser, YVO$_4$ laser YLF laser, YAlO$_3$ laser wherein Cr, Nd, Er, Ho, Ce, Co, Ti, Yb or Tm is doped can be used as the solid-state laser. A basic wave of the lasers is different depending on the materials of doping, therefore a laser beam having a basic wave of approximately 1 μm is obtained. A harmonic corresponding to the basic wave can be obtained by the using non-linear optical elements.

Figure 15B:
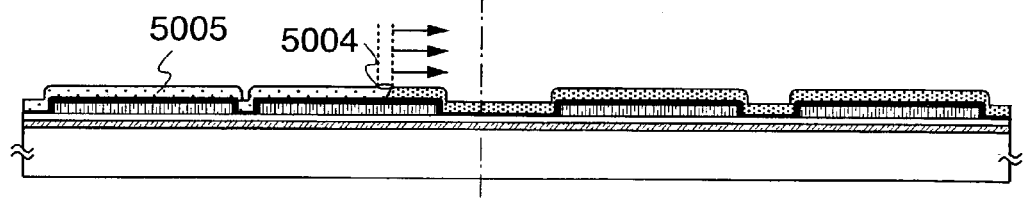

The semiconductor layer 5003 is subjected to laser light and enhanced the crystallinity by the above mentioned laser crystallization, a crystallized semiconductor layer 5005 is obtained (FIG. 15B).

Figure 15C:
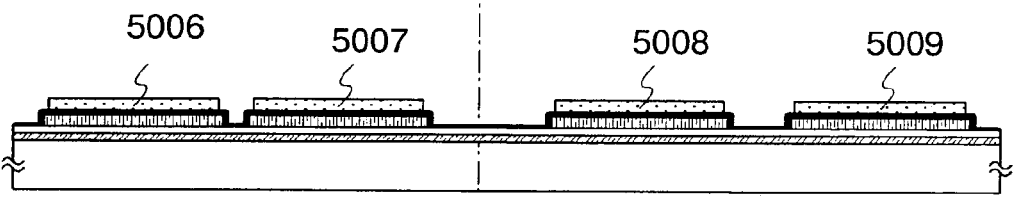

Subsequently, the semiconductor layer 5005 is patterned to a desired shape, thereby forming island-like semiconductor layers 5006 to 5009. (FIG. 15C)

After the island-like semiconductor layers 5006 to 5009 are formed, a small amount of impurity element (boron or phosphorus) may be doped in order to control a threshold value of the TFT.

Next, a gate insulating film 5010 covering the island-like semiconductor layers 5006 to 5009 is formed. The gate insulating film 5010 is formed by using an insulating film containing silicon with a thickness of 40 to 150 nm by using plasma CVD method or sputtering method. In this embodiment, a silicon oxynitride film (compositional ratio: Si=32%, O=59%, N=7% and H=2%) with a thickness of 110 nm is formed by the plasma CVD method. Notably, the gate insulating film is not limited to the silicon oxynitride film but an insulating film containing other silicon may be used as a single layer or as a laminated pad.

When a silicon oxide film is used, it is formed by mixing Tetraethyl Orthosilicate (TEOS) and O$_2$ by plasma CVD method, which is discharged under a condition with reaction pressure of 40 Pa, a substrate temperature of 300 to 400° C. and high frequency (13.56 MHz) power density of 0.5 to 0.8 W/cm$^2$. Thermal annealing at 400 to 500° C. thereafter can give good characteristics to the silicon oxide film formed in this way as a gate insulating film.

Next, a first conductive film 5011, which is 20 to 100 nm in thickness, and a second conductive film 5012, which is 100 to 400 nm in thickness, is stacked on the gate insulating film 5010. In this embodiment, the first conductive film 5011 formed by a TaN film with a thickness of 30 nm and the second conductive film 5012 formed by a W film with a thickness of 370 nm are stacked. The TaN film is formed by using Ta target to perform sputtering in an atmosphere containing nitrogen. The W film is formed by using W target to perform sputtering. Alternatively, it can be formed by thermal CVD method using tungsten hexafluoride (WF$_6$). In both cases, the use of the gate electrode needs low resistance. Therefore, the resistivity of the W film is desirably 20 μΩcm or less. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 μΩcm can be achieved.

While, in this embodiment, the first conductive film 5011 is TaN and the second conductive film 5012 is W, they are not limited in particular. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) film and the second conductive film formed by a W film, a combination of the first conductive film formed by a tantalum nitride (TaN) film and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Further, the present invention is not limited to a two-layer structure. For example, a three-layer structure may be adopted in which a tungsten film, an alloy film of aluminum and silicon (Al—Si), and a titanium nitride film are sequentially laminated. Moreover, in case of a three-layer structure, tungsten nitride may be used in place of tungsten, an alloy film of aluminum and titanium (Al—Ti) may be used in place of the alloy film of aluminum and silicon (Al—Si), and a titanium film may be used in place of the titanium nitride film.

Figure 15D:
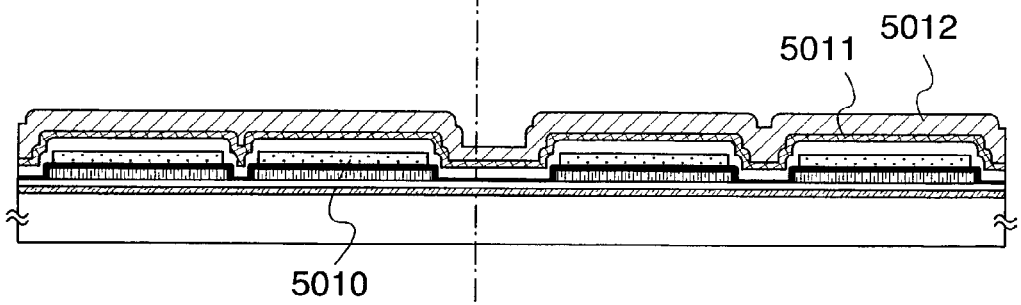

Note that, it is important that appropriate etching method or kinds of etchant is properly selected depending on the materials of a conductive film (FIG. 15D).

Next, a mask 5013 made of resist using photolithography method is formed, and a first etching processing is performed thereon in order to form electrodes and wires. The first etching processing is performed under first and second etching conditions. The first etching condition in this embodiment is to use Inductively Coupled Plasma (ICP) etching and to use CF$_4$ and Cl$_2$ and O$_2$ as an etching gas, whose amount of gases are 25/25/10 (sccm), respectively. 500 W of RF (13.56 MHz) power was supplied to a coil type electrode by 1 Pa pressure in order to generate plasma and then to perform etching. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the mask 5013 made of resist. Then, CF$_4$ and Cl$_2$ are used as etching gases. The ratio of the amounts of flowing gasses is 30/30 (sccm).

500 W of RF (13.56 MHz) power is supplied to a coil type electrode by 1 Pa pressure in order to generate plasma and then to perform etching for amount 30 seconds. 20 W of RF (13.56 MHz) power is also supplied to a substrate side (test sample stage) and substantially negative self-bias voltage is applied. Under the second etching condition where $CF_4$ and $Cl_2$ are mixed, both W film and TaN film were etched to the same degree. In order to etch without leaving a residue on the gate insulating film, the etching time may be increased 10 to 20% more.

Figure 15E:
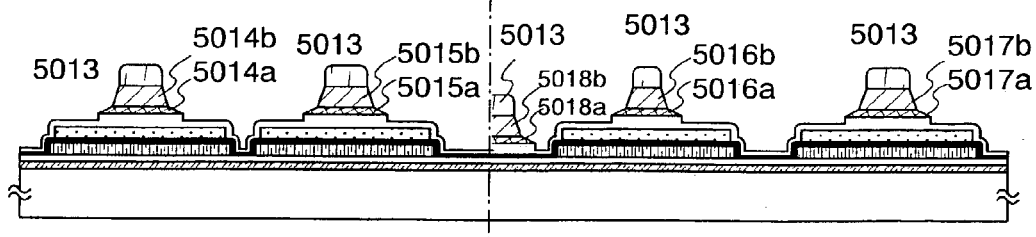

In the first etching processing, when the shape of the mask made of resist is appropriate, the shape of the ends of the first and the second conductive layers are in the tapered form due to the effect of the bias voltage applied to the substrate side. The angle of the tapered portion is 15 to 45°. Thus, conductive layers 5014 to 5018 in a first form are formed which include the first conductive layers and the second conductive layers (first conductive layers 5014a to 5018a and second conductive layer 5014b to 5018b) through the first etching processing. In a gate insulating film 5010, an area not covered by the conductive layers 5014 to 5018 in the first form is etched by about 20 to 50 nm so as to form a thinner area. (FIG. 15E)

Figure 16A:
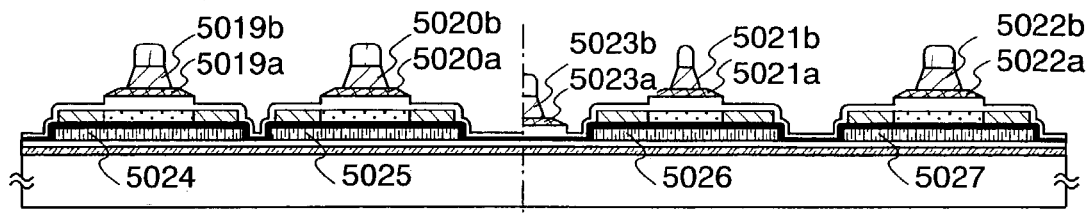
FIGS. 16A to 16E are explanatory views showing steps of manufacturing the semiconductor device.
Figure 16B:
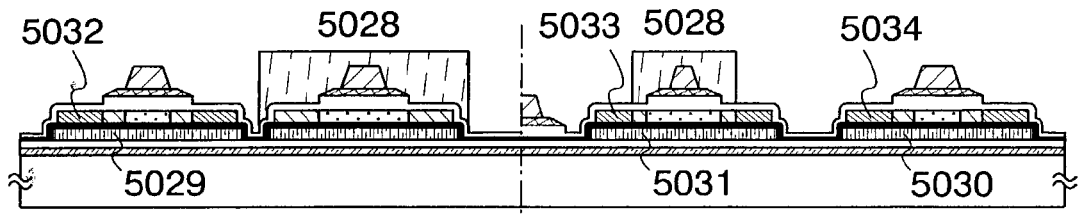

Next, a second etching processing is performed without removing mask 5013 made of resist. Here, $CF_4$, $Cl_2$ and $O_2$ are used as an etching gas to etch the W film selectively. Then, second conductive layers 5019b to 5023b are formed by the second etching processing. On the other hand, the first conductive layers 5014a to 5018a are not etched very much, and first conductive layers 5019a to 5023a are formed, and conductive layers 5019 to 5023 in a second form are formed. (FIG. 16A)

First doping processing is performed without removing mask 5013 made of resist and low density of impurity element, which gives n-type to the island-like semiconductor layer, is added. The doping processing may be performed by the ion-doping method or the ion-implanting method. The ion doping method is performed under a condition in the dose of $1\times10^{13}$ to $5\times10^{14}$ atoms/cm$^2$ and the accelerating voltage of 40 to 80 kV. In this embodiment, the ion doping method is performed under a condition in the dose of $1.5\times10^{13}$ atoms/cm$^2$ and the accelerating voltage of 60 kV. The n-type doping impurity element may be Group 15 elements, typically phosphorus (P) or arsenic (As). Here, phosphorus (P) is used. In this case, the conductive layers 5019 to 5023 function as masks for the n-type doping impurity element. Therefore, impurity areas 5024 to 5027 are formed in the self-alignment manner. An n-type doping impurity element in the density range of $1\times10^{18}$ to $1\times10^{20}$ atoms/cm$^3$ are added to the impurity areas 5024 to 5027.

When mask 5013 made of resist are removed, new mask 5028 made of resist are formed. Then, second doping processing is performed by using higher accelerating voltage than that used in the first doping processing. The ion doping method is performed under a condition in the dose of $1\times10^{13}$ to $1\times10^{15}$ atoms/cm$^2$ and the accelerating voltage of 60 to 120 kV. In the doping processing, the second conductive layers 5019b to 5023b are used as masks against the impurity element. Doping is performed such that the impurity element can be added to the semiconductor layer at the bottom of the tapered portion of the first conductive layer. Then, third doping processing is performed by having lower accelerating voltage than that in the second doping processing to obtain a condition shown in FIG. 16B. The ion doping method is performed under a condition in the dose of $1\times10^{15}$ to $1\times10^{17}$ atoms/cm$^2$ and the accelerating voltage of 50 to 100 kV. Through the second doping processing and the third doping processing, an n-type doping impurity element in the density range of $1\times10^{18}$ to $5\times10^{19}$ atoms/cm$^3$ is added to the low density impurity area 5029, which overlaps with the first conductive layer. An n-type doping impurity element in the density range of $1\times10^{19}$ to $5\times10^{21}$ atoms/cm$^3$ is added to the high density impurity areas 5032 and 5033.

With proper accelerating voltage, the low density impurity area and the high density impurity area can be formed by performing the second doping processing and the third doping processing once.

Figure 16C:
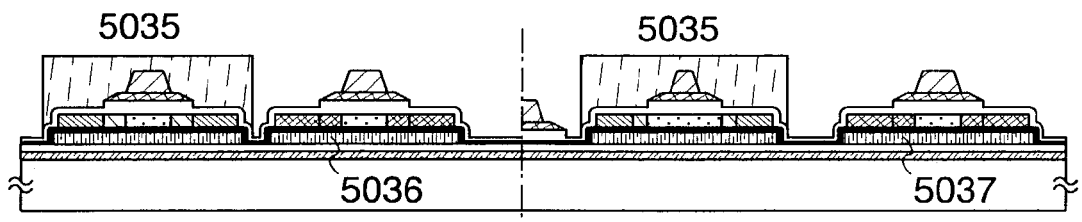

Next, after removing mask 5028 made of resist, new mask 5035 made of resist are formed to perform the fourth doping processing. Through the fourth doping processing, impurity areas 5036 and 5037, to which an impurity element doping a conductive type opposite to the one conductive type is added, in a semiconductor layer, which is an active layer of a p-channel type TFT. Second conductive layers 5019b to 5023b are used as mask against the impurity element, and the impurity element giving p-type is added so as to form impurity areas in the self-alignment manner. In this embodiment, the impurity areas 5036 and 5037 are formed by applying ion-doping method using diborane ($B_2H_6$) (FIG. 16C). During the fourth doping processing, the semiconductor layer forming the n-channel TFT is covered by mask 5035 made of resist. Thorough the first to the third doping processing, phosphorus of different densities is added to each of the impurity areas 5036 and 5037. Doping processing is performed such that the density of p-type doping impurity element can be $1\times10^{19}$ to $5\times10^{21}$ atoms/cm$^3$ in both areas. Thus, no problems are caused when they function as the source region and the drain region of the p-channel TFT.

Impurity areas are formed in the island-like semiconductor layers, respectively, through the processes above.

Next, the mask 5035 made of resist are removed and a first interlayer insulating film 5038 is formed thereon. The first interlayer insulating film 5038 may be an insulating film with a thickness of 50 to 200 nm containing silicon, which is formed by plasma CVD method or sputtering method. In this embodiment, silicon oxynitride film with a thickness of 100 nm is formed by plasma CVD method. The first interlayer insulating film 5038 is not limited to the silicon oxynitride film but may be the other insulating film containing silicon in a single layer or in a laminated pad.

Figure 16D:
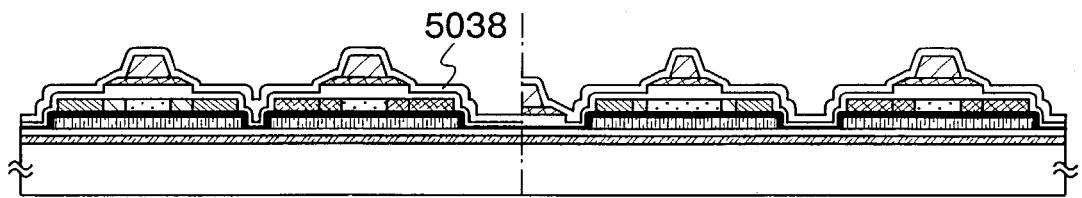

Next, as shown in FIG. 16D, activation processing is performed by using laser irradiation method. When a laser annealing method is used, the laser used in the crystallization can be used. When the activation processing is performed, the moving speed is same as the crystallization, and an energy density of about 0.01 to 100 MW/cm$^2$ (preferably, 0.01 to 10 MW/cm$^2$) is required. Also, a continuous oscillation laser may be used in the case the crystallization is performed and a pulse oscillation laser may be used in the case the activation is performed.

Also, the activation processing may be conducted before the first interlayer insulating film is formed.

After the heating processing (thermal processing at 300 to 550° C. for 1 to 12 hours) is performed, hydrogenation can be performed. This process terminates the dangling bond of the semiconductor layer with hydrogen contained in the first interlayer insulating film 5038. Alternatively, the hydrogenation may be plasma hydrogenation (using hydrogen excited by plasma) or heating processing in an atmosphere containing 3 to 100% of hydrogen at 300 to 650° C. for 1 to 12 hours. In this case, the semiconductor layer can be hydrogenated regardless of the existence of the first interlayer insulating film.

Next, a second interlayer insulating film 5039 formed by an inorganic insulating material or an organic insulator material is formed on the first interlayer insulating film 5038. In this embodiment, an acrylic resin film with a thickness of 1.6 μm is formed. Next, after the second interlayer insulating film 5039 is formed, the third interlayer insulating film 5040 is formed to contact with the second interlayer insulating film 5039.

Figure 16E:
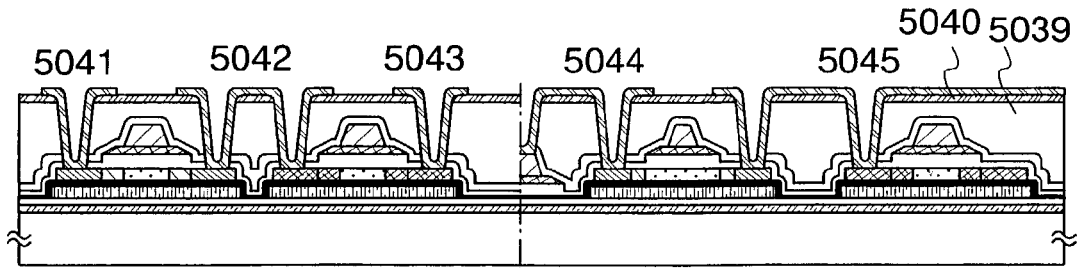

Wirings 5041 to 5045 are formed. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate pad including three or more layers. The materials of the wirings are not limited to Al and Ti. For example, the wiring can be formed by forming Al or Cu on a TaN film and then by patterning the laminate film in which a Ti film is formed (FIG. 16E).

In this way, the driver circuit having a CMOS circuit including an n-channel TFT and a p-channel TFT, and the pixel portion having the pixel TFT and the storage capacitor can be formed on the same substrate. Thus, an active matrix substrate is completed.

Present invention can be implemented by combining with other embodiments.

Embodiment 7

Figure 17:
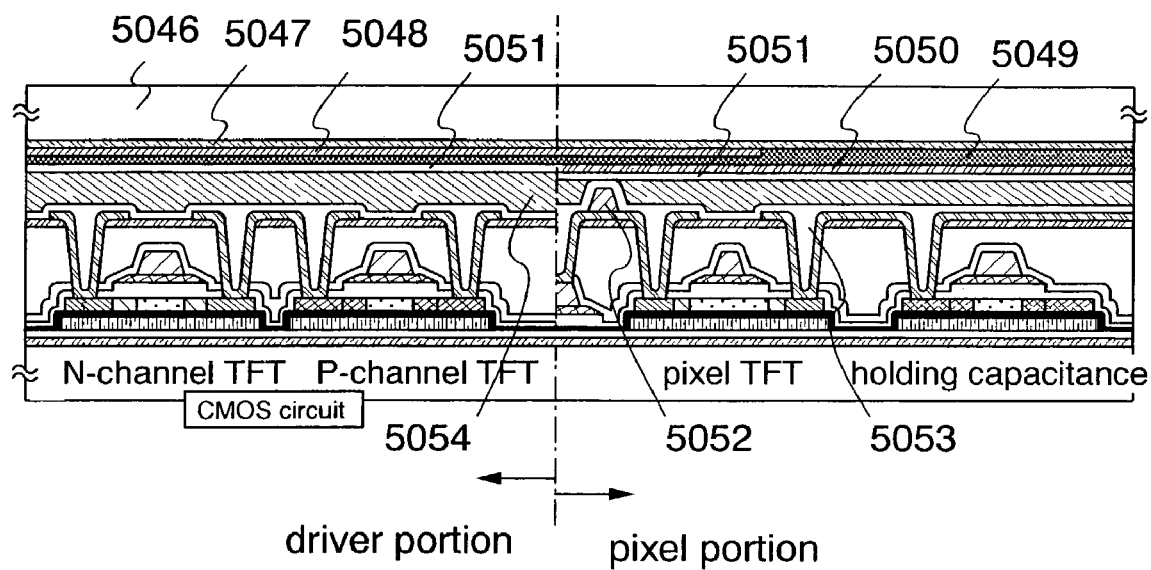
FIG. 17 is an explanatory view showing steps of manufacturing a liquid crystal display device.

This embodiment explains, below, a process to manufacture a reflection type liquid crystal display device from the active matrix substrate made in Embodiment 6, using FIGS. 16 and 17.

First, after obtaining an active matrix substrate in the state of FIG. 16E according to Embodiment 5, an orientation film 5053 is formed at least on the wiring (the pixel electrodes) 5045 on the active matrix substrate of FIG. 16E and subjected to a rubbing process. Incidentally, in this embodiment, prior to forming an orientation film 5053, an organic resin film such as an acrylic resin film is patterned to form columnar spacers 5052 in a desired position to support the substrates with spacing. Meanwhile, spherical spacers, in place of the columnar spacers, may be distributed over the entire surface of the substrate. Then, a counter substrate 5046 is prepared. Then, coloring layers (namely color filter) 5047, 5048 (here, only two color filters are shown, but three color filters R, G, B may be used practically) and a planarizing film 5049 are formed on a counter substrate 5046. A shielding portion is formed by overlapping a red coloring layer 5047 and a blue coloring layer 5048 together. Meanwhile, the shielding portion may be formed by partly overlapping a red coloring layer and a green coloring layer. Similarly, slits adjacent to one another among the pixels are shielded by a laminate layer of the color filters. The shielding film formation process is thus omitted.

Then, a counter electrode 5050 of a transparent conductive film is formed on the planarizing film 5049 at least in the pixel portion. An orientation film 5051 is formed over the entire surface of the counter substrate and subjected to a rubbing process. Then, the active matrix substrate and the counter substrate are bonded together by a seal member (not shown). The seal member (not shown) is mixed with filler so that the filler and the columnar spacers bond together the two substrates through an even spacing. Thereafter, a liquid crystal material 5054 is poured between the substrates, and completely sealed by a sealant (not shown). The liquid crystal material 5054 may be a known liquid crystal material. In this manner, completed is a reflection type liquid crystal display device shown in FIG. 17. If necessary, the active matrix substrate or counter substrate is divided into a desired shape. Furthermore, a polarizing plate (not shown) is bonded only on the counter substrate. Then, an FPC is bonded by a known technique. The liquid crystal display device manufactured as above comprises TFT manufactured by a semiconductor film, wherein a laser beam having a periodic or uniform energy distribution is irradiated and a crystal grain with a large grain size is formed. Thus, the liquid crystal display device ensures a good operational characteristic and high reliability. The liquid crystal display device can be used as a display portion for an electronic appliance in various kinds.

Incidentally, this embodiment can be implemented by combining with other embodiments.

Embodiment 8

In this embodiment, an example of manufacturing method for a light emitting device will be described. The manufacturing method uses an active matrix substrate manufactured using the manufacturing method for the active matrix substrate described in Embodiment 6. The "light emitting device" is a generic name of a display panel formed such that light-emitting elements formed on a substrate are hermetically enclosed into between the substrate and a cover material, and a display module in which TFTs and the like are mounted on the display panel. The light-emitting element includes a layer (light-emitting layer) containing an organic compound with which electroluminescence generated by an electric field being applied is obtained, an anode layer, and a cathode layer. The electroluminescence in the organic compound has two types: the one is luminescence (fluorescence) generated when the state returns from a singlet excited state to a normal state; and the other is luminescence (phosphorescence) generated when the state returns from a triplet excited state to a normal state. The organic compound of this embodiment includes either one of these two types or the two types.

In the present specification, all layers formed between the anode and the cathode in the light-emitting element are defined as EL layers. In specific, the EL layers include a light-emitting layer, a hole injection layer, an electron injection layer, a hole transporting layer, and an electron transporting layer. Basically, the light-emitting element has a structure in which an anode layer, a light-emitting layer, and a cathode layer are overlaid in that order. However, in addition to the structure, the light-emitting layer has a structure in which, for example, an anode layer, a hole injection layer, a light-emitting layer, and a cathode layer are overlaid in that order; or, for example, an anode layer, a hole injection layer, a light-emitting layer, an electron transporting layer, and a cathode layer are overlaid in that order.

Figure 18A:
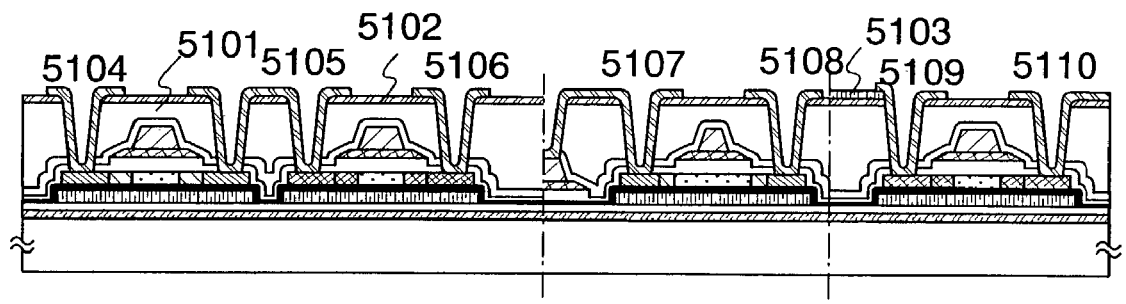
FIGS. 18A and 18B are explanatory views showing steps of manufacturing a light emitting device.

As shown in FIG. 18A, after the formation of layers up to a third interlayer insulation film 5102 according to Embodiment 6, the pixel electrode working as the anode of the light-emitting element is formed of a transparent conductive film. To form the transparent conductive film, there can be used any one of a compound of indium oxide and stannic oxide, a compound of indium oxide and zinc oxide, zinc oxide, stannic oxide, and indium oxide. Alternatively, a transparent conductive film containing gallium may be used.

In the case of the light emitting device, the third interlayer insulation film 5102 is effective to prevent intrusion of moisture contained in the second interlayer insulation film 5101 into the organic light-emitting layer. When the second interlayer insulation film 5101 contains an organic resin material, since the organic resin material contains much moisture, the provision of the third interlayer insulation film 5102 is significantly effective. In addition, in this embodiment, it is very important to level stepped portions formed with TFTs by using the second interlayer insulation film 5101 formed of the resin. Since the light-emitting layer to be formed in a later step is very thin, defects in light emission can occur because of the existence of the steps. For this reason, the stepped portions are desirably leveled before the formation of the pixel electrode so that the light-emitting layer can be formed on a surface leveled as flat as possible.

The n-channel TFT and the p-channel TFT contained in the drive circuit are formed using the manufacturing method according to Embodiment 6. In this embodiment, while the TFTs have a single-gate structure, the TFTs may have a double-gate structure or a triple-gate structure.

Figure 18B:
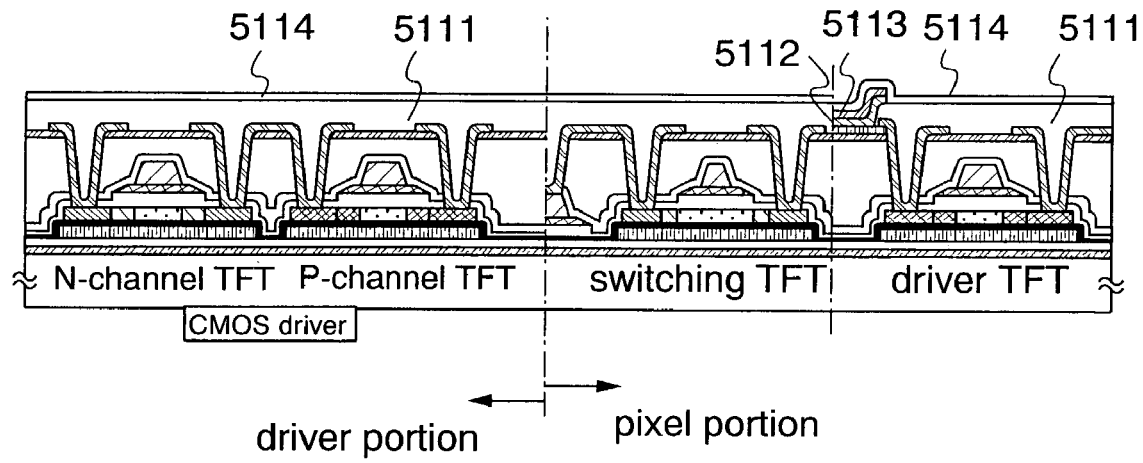

Subsequently, as shown in FIG. 18B, a resin film formed of diffused materials, such as a black dye, carbon, and black pigment, is formed in such a manner as to cover the third inter layer insulation film 5102, an opening is formed in a portion to be a light emitting element and a shielding film (not shown) is thus formed. As the resin, representative examples include, for example, polyimide, polyamide, acrylic resin, and benzocyclopolybutene (BCB); however, the material is not limited thereto. A material other than the organic resin may also be used as a material of the shielding film, of which examples are materials made by mixing a black dye, carbon, or black pigment with silicon, silicon oxide, silicon oxynitride, or the like. The shielding film is effective to prevent outside light reflected on wirings 5104 to 5110 from being visible to the eye of a viewer. After the above-described processing, contact holes reaching the individual impurity regions are opened, and the wirings 5104 to 5110 are then formed.

Subsequently, a bank 5111 is formed of a resin material. The bank 5111 is formed such that an acrylic film or polyimide film having a thickness of 1 to 2 µm is patterned to allow a pixel electrode 5103 to partly be exposed.

An EL layer 5112 is formed over the pixel electrode 5103. While FIG. 18B shows only one pixel, EL layers are separately formed corresponding to the individual colors R (red), G (green), and B (blue) in this embodiment. In addition, in this embodiment, a low-molecular based organic light-emitting material is formed by an evaporation method. Specifically, the material is formed to be a multi-layered structure such that a 20-nm thick copper phthalocyanine (CuPc) film is provided as a hole injection layer, and a 70-nm thick tris-8-hydroxyquinolinato aluminum complex ($Alq_3$) film is formed thereon as a light-emitting layer. The luminescent color can be controlled by adding a fluorescent pigment, such as quinacridone, perylene, or DCMl, to $Alq_3$.

However, the above are simply example of organic light-emitting materials which can be used as the light-emitting film, and the present invention is not limited thereto in any way. The light-emitting layer (layer for causing light emission and a carrier thereof to move) may be formed by arbitrarily combining light-emitting layers and charge transporting films (or, charge injection layers). For example, while this embodiment has been described with reference to the example in which the low-molecular based organic light-emitting material is used as the light-emitting material, either intermediate-molecular based organic light-emitting material or a high-molecular based organic light-emitting material maybe used. In this case, an intermediate molecular weight organic light-emitting material can be defined that an aggregate of an organic compound which does not have subliming property or dissolving property (preferably, an aggregate which has molecularity of 10 or less), or an organic compound which has a molecular chain length of 5 µm of less (preferably 50 nm or less). As an example use of the high molecular based organic light-emitting material, a multi-layered structure may be formed such that a 20-nm polythiophene (PEDOT) film is provided by spin coating as a hole injection film, and a polyphenylene vinylene (PPV) film of about 100 nm is provided thereon as a light-emitting film. Meanwhile, when π-conjugate based high molecules are used, light-emission wavelengths for a color range of from red to blue become selectable. Moreover, for example, an inorganic material such as silicon carbide may be used as a material of, for example, the charge transporting film or the charge injection layer. For these organic light-emitting materials and inorganic materials, known materials may be used.

Next, a pixel electrode 5113 is provided as a cathode on the EL layer 5112. In this embodiment, an aluminium-lithium alloy layer is used as the conductive film. As a matter of course, a known MgAg film (magnesium-silver alloy layer) may be used. For the material of the cathode, either a conductive film formed of elements belonging to Group 1 or 2 in the periodic table or a conductive film to which these materials are added may be used.

The light-emitting element is completed upon formation of the layers up to the pixel electrode 5113. In this case, the light-emitting element refers to an element formed of the pixel electrode 5103 (anode), the EL layer 5112, and the cathode 5113.

In addition, a protection film 5114 may be formed in such a manner as to fully cover the light-emitting element. The protection film 5114 is formed of an insulation film including a carbon layer, a silicon nitride film, or a silicon oxynitride film, in which the insulation film is used in the form of either a single layer or a combined multilayer.

In this case, a film having a good coverage is preferably used for the protection film 5114; specifically, using a carbon film, particularly, a DLC (diamond-like carbon) film is effective. Since the DLC film can be formed in a temperature range of from a room temperature to 100° C. or lower, the film can easily be formed also on an upper portion of the EL layer 5112 having a low heat resistance. In addition, since the DLC film has a high blocking effect against oxygen, oxidization of the EL layer 5112 can be suppressed. This enables possible oxidization of the EL layer 5112 from occurring while a subsequent sealing step is being performed.

As described above, according to this embodiment, all the EL layers 5112 are covered by the inorganic insulation film that has a high barrier property and that is formed of, for example, carbon, silicon nitride, silicon oxynitride, aluminium nitride, or aluminium oxynitride. Accordingly, the EL layer can be prevented even more efficiently from being deteriorated due to entrance of moisture, oxygen, and the like.

In addition, when a silicon nitride film formed by a silicon-targeted sputtering method is used for the third interlayer insulation film 5102 and the protection film 5114, entrance of impurity into the EL layer can be prevented even more efficiently. While film formation conditions may appropriately be selected, sputtering is preferably performed using a nitrogen ($N_2$) or nitrogen-argon mixture gas and applying a high frequency power. In this case, the substrate temperature may be maintained at a room temperature, and no heating means needs to be used. When an organic insulation film, an organic compound layer, or the like has already been formed, the film formation is desirably performed with the substrate not being heated. However, in order to completely remove absorbed or occluded moisture, dehydrogenation processing is preferably performed by heating the object for a period of several minutes to several hours at a temperature of 50 to 100° C. in a vacuumed condition.

It is known that when a silicon nitride film is formed according to a sputtering method performed in such a manner that silicon is targeted in a room temperature, a high frequency power of 13.56 MHz is applied, and only a nitrogen gas is used, the silicon nitride film is characterized as described hereunder. That is, in infrared adsorption spectra thereof, adsorption peaks of an N—H connection and a Si—H connection are not observed, nor is an adsorption peak of a Si—O connection is not observed. In addition, the oxygen concentration and the hydrogen concentration in the film are not higher than 1 atom %. Also from the above, it can be known that entrance of impurity such as oxygen and moisture can be prevented even more efficiently.

In this manner, the light-emitting device having the structure as shown in FIG. 18B is completed. Note that, it is effective that the steps up to the formation of the protection film 5114 after the formation of the bank 5111 are not exposed to the atmosphere, but are continually processed.

In this embodiment, while the shielding film is formed between the third interlayer insulation film 5102 and the bank 5111, the present invention is not limited thereto. It is essential that the shielding film be provided in a position where outside light reflected in the wirings 5104 to 5110 is prevented from being visible to a viewer. For example, as in this embodiment, in the configuration where light emitted from the light-emitting element is directed to the substrate, the shielding film may be provided between the first interlayer insulation film and the second interlayer insulation film 5101. Also in this case, the shielding film includes an opening to enable the light form the light-emitting element to pass.

In addition, as described in Embodiment 6, the provision of the impurity region overlapping the gate electrode via the insulation film enables the formation of the n-channel TFT that has high resistance against deterioration occurring due to hot carrier effects. Accordingly, the light emitting device having high reliability can be implemented.

In this embodiment, only the configurations of the pixel portion and the drive circuit have been described. However, according to the manufacturing steps of this embodiment, other logic circuits, such as a signal dividing circuit, a D/A converter, an operational amplifier, and γ compensation circuit, can be formed on the same insulation material. Further, a memory, a microprocessor, and the like can also be formed.

The light emitting device manufactured as described above can be such that laser light of which energy distributions are periodic and uniform is irradiated, that includes TFTs manufactured using semiconductor layers in which large-size crystal grains are formed, and that exhibits sufficient performance characteristics and reliability. Illuminators of the type described above can be used as display portions of various electronic devices.

According to this embodiment, light emitted from the light-emitting element is directed to the TFT. However, the light may be directed to the side opposing the TFT. In this case, a resin mixed with a black dye, carbon, or black pigment may be used for the bank 5111. In this case, a material having high reflectance is used for the pixel electrode 5103, and a transparent conductive film is used for the pixel electrode 5113.

This embodiment may be implemented in combination with other embodiments.

Embodiment 9

Although it is described in "Summary of the Invention", when the slit-shaped unevenness is formed on the substrate and stress concentration resulting from the crystallization of the semiconductor layer on edges and their vicinities of the unevenness is caused, it is preferable that an arrangement of a TFT is made in which the channel formation region thereof does not cross the edges of the unevenness as shown in FIGS. 19A to 19D.

Figure 19A:
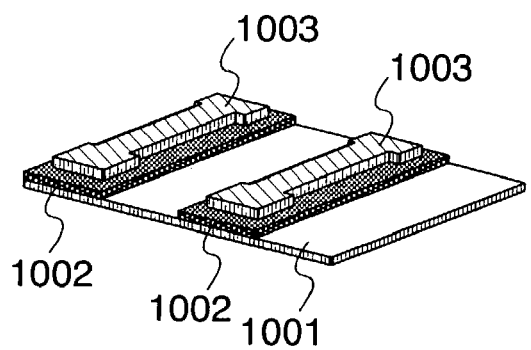
FIGS. 19A to 19D show arrangement examples of an island-like semiconductor layer on a substrate surface having an unevenness portion.
Figure 19B:
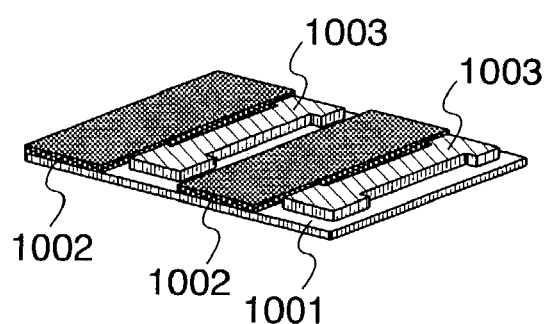
Figure 19C:
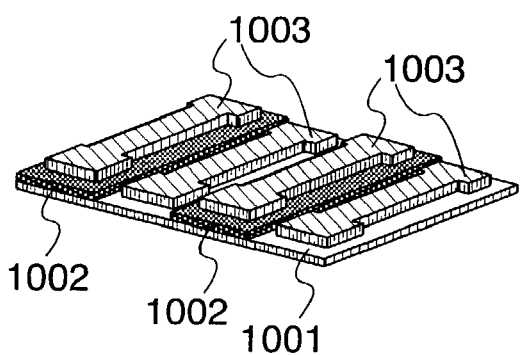

As shown in FIG. 19A, an island-like semiconductor layer 1003 which becomes the active layer of a TFT may be formed only on a base layer 1002, that is, only on a convex portion of the unevenness surface. In addition, as shown in FIG. 19B, the island-like semiconductor layer may be formed only on a substrate 1001, that is, only on a concave portion of the unevenness surface. Further, as shown in FIG. 19C, the island-like semiconductor layer 1003 may be formed on both portions. As apparent from these drawings, any island-like semiconductor layer is formed without crossing the edges of the unevenness.

Figure 19D:
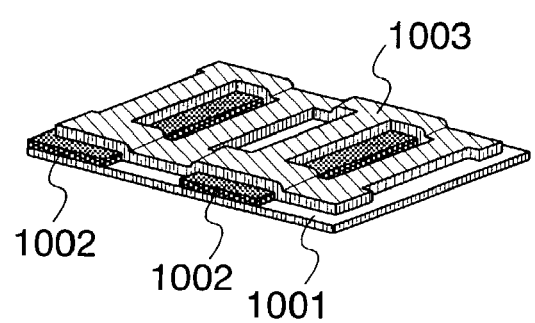

Note that, as shown in FIG. 19D, a portion which becomes the source region or the drain region of a multi-channel TFT may cross the edge portions of the unevenness. Even in this case, it is apparent that the channel formation region is separately formed so as to bypass the edge portions of the unevenness.

Embodiment 10

Examples of such electronic apparatuses manufactured by applying the present invention include a video camera, a digital camera, a goggles-type display (head mount display), a navigation system, a sound reproduction device (a car audio equipment and an audio set), a lap-top computer, a game machine, a portable information terminal (a mobile computer, a mobile phone, a portable game machine, an electronic book, or the like), an image reproduction device including a recording medium (more specifically, an device which can reproduce a recording medium such as a digital versatile disc (DVD) and so forth, and includes a display for displaying the reproduced image), or the like. In particular, in the case of the portable information terminal, use of the light emitting device is preferable, since the portable information terminal that is likely to be viewed from a tilted direction is often required to have a wide viewing angle. FIG. 20 respectively shows various specific examples of such electronic apparatuses.

Figure 20A:
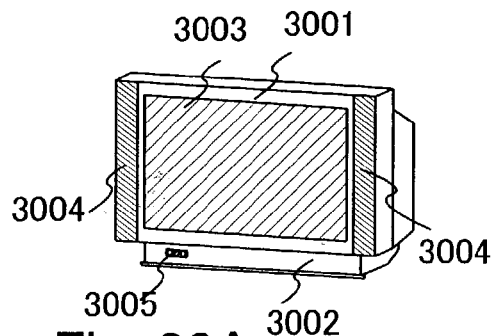
FIGS. 20A to 20H show examples of electronic devices to which the present invention can be applied.

FIG. 20A illustrates a light emitting element display device which includes a casing 3001, a support table 3002, a display portion 3003, a speaker portion 3004, a video input terminal 3005 or the like. The present invention is applicable to the display portion 3003. The light emitting device is of the self-emission-type and therefore requires no backlight. Thus, the display portion thereof can have a thickness thinner than that of a liquid crystal display device. The light emitting display device is including the entire display device for displaying information, such as a personal computer, a receiver of TV broadcasting and an advertising display.

Figure 20B:
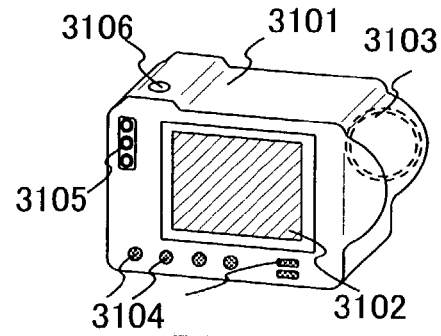

FIG. 20B illustrates a digital still camera which includes a main body 3101, a display portion 3102, an image receiving portion 3103, an operation key 3104, an external connection port 3105, a shutter 3106, or the like. The present invention can be used for manufacturing the display portion 3102.

Figure 20C:
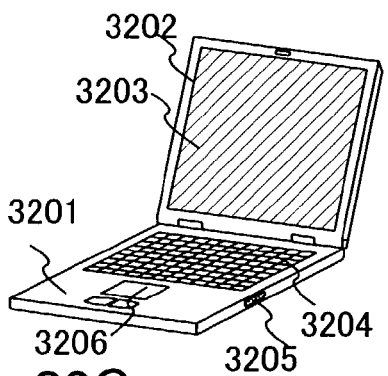

FIG. 20C illustrates a lap-top computer which includes a main body 3201, a casing 3202, a display portion 3203, a keyboard 3204, an external connection port 3205, a pointing mouse 3206, or the like. The present invention can be used for manufacturing the display portion 3203.

Figure 20D:
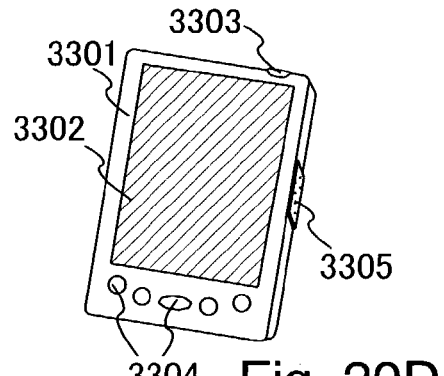

FIG. 20D illustrated a mobile computer which includes a main body 3301, a display portion 3302, a switch 3303, an operation key 3304, an infrared port 3305, or the like. The present invention can be used for manufacturing the display portion 3302.

Figure 20E:
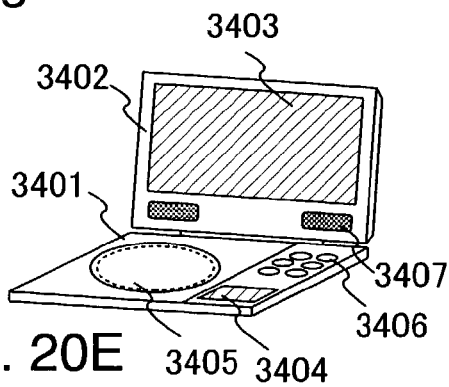

FIG. 20E illustrates a portable image reproduction device including a recording medium (more specifically, a DVD reproduction device), which includes a main body 3401, a casing 3402, a display portion A 3403, another display portion B 3404, a recording medium (DVD or the like) reading portion 3405, an operation key 3406, a speaker portion 3407 or the like. The display portion A 3403 is used mainly for displaying image information, while the display portion B 3404 is used mainly for displaying character information. The present invention can be used for manufacturing these display portions A 3403 and B 3404. The image reproduction device including a recording medium further includes a game machine or the like.

Figure 20F:
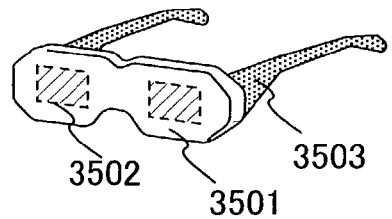

FIG. 20F illustrates a goggle type display (head mounted display) which includes a main body 3501, a display portion 3502, arm portion 3503 or the like. The present invention can be used for manufacturing the display portion 3502.

Figure 20G:
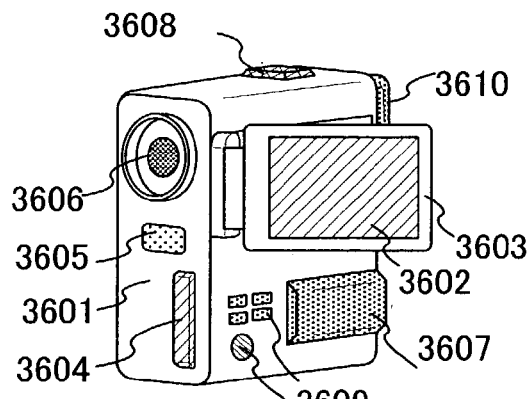

FIG. 20G illustrates a video camera which includes a main body 3601, a display portion 3602, a casing 3603, an external connecting port 3604, a remote control receiving portion 3605, an image receiving portion 3606, a battery 3607, a sound input portion 3608, an operation key 3609, an eyepiece portion, and the like. The present invention can be used for manufacturing the display portion 3602.

Figure 20H:
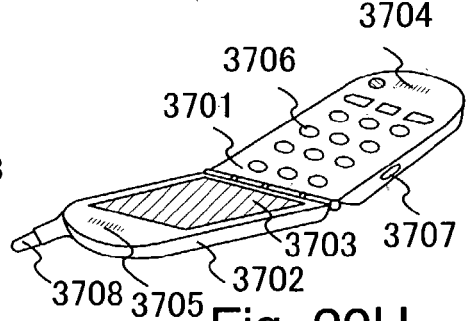

FIG. 20H illustrates a mobile phone which includes a main body 3701, a casing 3702, a display portion 3703, a sound input portion 3704, a sound output portion 3705, an operation key 3706, an external connecting port 3707, an antenna 3708, or the like. Note that the display portion 3703 can reduce power consumption of the mobile telephone by displaying white-colored characters on a black-colored background. The present invention can be used for manufacturing the display portion 3703.

When a brighter luminance of light emitted from the organic light emitting material becomes available in the future, the light emitting device in accordance with the present invention will be applicable to a front-type or rear-type projector in which light including output image information is enlarged by means of lenses or the like to be projected.

The aforementioned electronic apparatuses are more likely to be used for display information distributed through a telecommunication path such as Internet, a CATV (cable television system), and in particular likely to display moving picture information. The light emitting device is suitable for displaying moving pictures since the organic light emitting material can exhibit high response speed.

A portion of the light emitting device that is emitting light consumes power, so it is desirable to display information in such a manner that the light emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light emitting portion while a non-emission portion corresponds to the background.

According to the present invention, when the slit-shaped unevenness portion is provided on the substrate, stress produced when the semiconductor layer is crystallized concentrates on the edges and their vicinities of the unevenness portion. In other words, a stress concentrating location can be controlled by a designer and a circuit can be manufactured by efficiently using the semiconductor layer in which preferable crystallinity is obtained.

Also, when a TFT having a large W is produced for a buffer, a sampling switch, and the like, there is used the structure in which TFTs having a small W using active layers formed so as to align the slit-shaped unevenness portion on the substrate and the channel formation region in a parallel direction or a substantially parallel direction are connected in parallel. Thus, even when the characteristics of the respective TFTs are varied, the variation can be averaged. Accordingly, as compared with a TFT having a large W which is made from a single active layer, a TFT with less variation can be produced.

What is claimed is:

1. A method of manufacturing a semiconductor device comprising:
    forming a base layer on a substrate and patterning the base layer in slit shapes to form a surface having an unevenness on the substrate;
    forming a semiconductor layer on the surface having the unevenness;
    irradiating linearly condensed laser light to the semiconductor layer while being scanned relative to the substrate to obtain a crystalline semiconductor layer;
    patterning the crystalline semiconductor layer in a predetermined shape to form first and third island-like semiconductor layers on the substrate and second and fourth island-like semiconductor layers on the base layer; and
    producing a first transistor using the first and second island-like semiconductor layers connecting in parallel as active layers and a second transistor using the third and fourth island-like semiconductor layers connecting in parallel as active layers.

2. The method of manufacturing a semiconductor device according to claim 1, wherein the first, second, third and fourth island-like semiconductor layers are patterned into a shape such that a channel formation region of the first transistor and a channel formation region of the second transistor do not cross a boundary between a concave portion and a convex portion of the unevenness.

3. The method of manufacturing a semiconductor device according to claim 1, wherein the laser light is irradiated from one selected from the group consisting of a continuous oscillation solid laser, a continuous oscillation gas laser, and a continuous oscillation metal laser.

4. The method of manufacturing a semiconductor device according to claim 1, wherein the laser light is irradiated from one selected from the group consisting of a continuous oscillation YAG laser, a continuous oscillation $YVO_4$ laser, a continuous oscillation YLF laser, a continuous oscillation $YAlO_3$ laser, a continuous oscillation glass laser, a continuous oscillation ruby laser, a continuous oscillation alexandrite laser, and a continuous oscillation Ti:sapphire laser.

5. The method of manufacturing a semiconductor device according to claim 1, wherein the laser light is irradiated from one selected from the group consisting of a continuous oscillation excimer laser, a continuous oscillation Ar laser, a continuous oscillation Kr laser, and a continuous oscillation $CO_2$ laser.

6. The method of manufacturing a semiconductor device according to claim 1, wherein the laser light is irradiated from one selected from the group consisting of a continuous oscillation helium-cadmium laser, a continuous oscillation copper vapor laser, and a continuous oscillation gold vapor laser.

7. The method of manufacturing a semiconductor device according to claim 1, wherein the base layer is patterned into the slit shapes such that a film thickness is 30 nm to 300 nm and a width is 1 μm to 10 μm for each.

8. A method of manufacturing a semiconductor device comprising:
   forming a base layer on a substrate and patterning the base layer in slit shapes to form a surface having an unevenness on the substrate;
   forming a semiconductor layer on the surface having the unevenness;
   forming a metal contained layer on the semiconductor layer and performing heat treatment to obtain a first crystalline semiconductor layer;
   irradiating linearly condensed laser light to the first crystalline semiconductor layer while being scanned relative to the substrate to obtain a second crystalline semiconductor layer;
   patterning the second crystalline semiconductor layer in a predetermined shape to form first and third island-like semiconductor layers on the substrate and second and fourth island-like semiconductor layers on the base layer; and
   producing a first transistor using the first and second island-like semiconductor layers connecting in parallel as active layers and a second transistor using the third and fourth island-like semiconductor layers connecting in parallel as active layers.

9. The method of manufacturing a semiconductor device according to claim 8, wherein the first, second, third and fourth island-like semiconductor layers are patterned into a shape such that a channel formation region of the first transistor and a channel formation region of the second transistor do not cross a boundary between a concave portion and a convex portion of the unevenness.

10. The method of manufacturing a semiconductor device according to claim 8, wherein the laser light is irradiated from one selected from the group consisting of a continuous oscillation solid laser, a continuous oscillation gas laser, and a continuous oscillation metal laser.

11. The method of manufacturing a semiconductor device according to claim 8, wherein the laser light is irradiated from one selected from the group consisting of a continuous oscillation YAG laser, a continuous oscillation $YVO_4$ laser, a continuous oscillation YLF laser, a continuous oscillation $YAlO_3$ laser, a continuous oscillation glass laser, a continuous oscillation ruby laser, a continuous oscillation alexandrite laser, and a continuous oscillation Ti:sapphire laser.

12. The method of manufacturing a semiconductor device according to claim 8, wherein the laser light is irradiated from one selected from the group consisting of a continuous oscillation excimer laser, a continuous oscillation Ar laser, a continuous oscillation Kr laser, and a continuous oscillation $CO_2$ laser.

13. The method of manufacturing a semiconductor device according to claim 8, wherein the laser light is irradiated from one selected from the group consisting of a continuous oscillation helium-cadmium laser, a continuous oscillation copper vapor laser, and a continuous oscillation gold vapor laser.

14. The method of manufacturing a semiconductor device according to claim 8, wherein the base layer is patterned into the slit shapes such that a film thickness is 30 nm to 300 nm and a width is 1 μm to 10 μm for each.

15. A method of manufacturing a semiconductor device comprising:
   forming a base layer on a substrate and patterning the base layer in a slit shape to form a surface having an unevenness on the substrate;
   forming a semiconductor layer on the surface having the unevenness;
   irradiating linearly condensed laser light to the semiconductor layer while being scanned relative to the substrate to obtain a crystalline semiconductor layer;
   patterning the crystalline semiconductor layer in predetermined shapes to form a first island-like semiconductor layer on the substrate and a second island-like semiconductor layer on the base layer; and
   producing a transistor using the first island-like semiconductor layer and the second island-like semiconductor layer connecting in parallel as active layers.

16. The method of manufacturing a semiconductor device according to claim 15, wherein the island-like semiconductor layers are patterned into a shape such that a channel formation region of the transistor does not cross a boundary between a concave portion and a convex portion of the unevenness.

17. The method of manufacturing a semiconductor device according to claim 15, wherein the laser light is irradiated from one selected from the group consisting of a continuous oscillation solid laser, a continuous oscillation gas laser, and a continuous oscillation metal laser.

18. The method of manufacturing a semiconductor device according to claim 15, wherein the laser light is irradiated from one selected from the group consisting of a continuous oscillation YAG laser, a continuous oscillation $YVO_4$ laser, a continuous oscillation YLF laser, a continuous oscillation $YAlO_3$ laser, a continuous oscillation glass laser, a continuous oscillation ruby laser, a continuous oscillation alexandrite laser, and a continuous oscillation Ti:sapphire laser.

19. The method of manufacturing a semiconductor device according to claim 15, wherein the laser light is irradiated from one selected from the group consisting of a continuous oscillation excimer laser, a continuous oscillation Ar laser, a continuous oscillation Kr laser, and a continuous oscillation $CO_2$ laser.

20. The method of manufacturing a semiconductor device according to claim 15, wherein the laser light is irradiated from one selected from the group consisting of a continuous oscillation helium-cadmium laser, a continuous oscillation copper vapor laser, and a continuous oscillation gold vapor laser.

21. The method of manufacturing a semiconductor device according to claim 15, wherein the base layer is patterned into a slit shape such that a film thickness is 30 nm to 300 nm and a width is 1 μm to 10 μm.

22. A method of manufacturing a semiconductor device comprising:
   forming a base layer on a substrate and patterning the base layer in a slit shape to form a surface having an unevenness on the substrate;
   forming a semiconductor layer on the surface having the unevenness;
   forming a metal contained layer on the semiconductor layer and performing heat treatment to obtain a first crystalline semiconductor layer;

irradiating linearly condensed laser light to the first crystalline semiconductor layer while being scanned relative to the substrate to obtain a second crystalline semiconductor layer;

patterning the crystalline semiconductor layer in predetermined shapes to form a first island-like semiconductor layer on the substrate and a second island-like semiconductor layer on the base layer; and producing a transistor using the first island-like semiconductor layer and the second island-like semiconductor layer connecting in parallel as active layers.

23. The method of manufacturing a semiconductor device according to claim 22, wherein the island-like semiconductor layers are patterned into a shape such that a channel formation region of the transistor does not cross a boundary between a concave portion and a convex portion of the unevenness.

24. The method of manufacturing a semiconductor device according to claim 22, wherein the laser light is irradiated from one selected from the group consisting of a continuous oscillation solid laser, a continuous oscillation gas laser, and a continuous oscillation metal laser.

25. The method of manufacturing a semiconductor device according to claim 22, wherein the laser light is irradiated from one selected from the group consisting of a continuous oscillation YAG laser, a continuous oscillation $YVO_4$ laser, a continuous oscillation YLF laser, a continuous oscillation $YAlO_3$ laser, a continuous oscillation glass laser, a continuous oscillation ruby laser, a continuous oscillation alexandrite laser, and a continuous oscillation Ti:sapphire laser.

26. The method of manufacturing a semiconductor device according to claim 22, wherein the laser light is irradiated from one selected from the group consisting of a continuous oscillation excimer laser, a continuous oscillation Ar laser, a continuous oscillation Kr laser, and a continuous oscillation $CO_2$ laser.

27. The method of manufacturing a semiconductor device according to claim 22, wherein the laser light is irradiated from one selected from the group consisting of a continuous oscillation helium-cadmium laser, a continuous oscillation copper vapor laser, and a continuous oscillation gold vapor laser.

28. The method of manufacturing a semiconductor device according to claim 22, wherein the base layer is patterned into a slit shape such that a film thickness is 30 nm to 300 nm and a width is 1 μm to 10 μm.

* * * * *